US012348884B2

(12) United States Patent
Sato et al.

(10) Patent No.: US 12,348,884 B2
(45) Date of Patent: Jul. 1, 2025

(54) IMAGING DEVICE AND METHOD FOR DRIVING THE SAME

(71) Applicant: Panasonic Intellectual Property Management Co., Ltd., Osaka (JP)

(72) Inventors: Yoshihiro Sato, Osaka (JP); Takayuki Nishitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 190 days.

(21) Appl. No.: 18/452,612

(22) Filed: Aug. 21, 2023

(65) Prior Publication Data

US 2023/0403479 A1    Dec. 14, 2023

Related U.S. Application Data

(63) Continuation of application No. PCT/JP2022/004158, filed on Feb. 3, 2022.

(30) Foreign Application Priority Data

Mar. 16, 2021 (JP) ................. 2021-042047

(51) Int. Cl.
*H04N 25/65* (2023.01)
*H04N 25/709* (2023.01)
(Continued)

(52) U.S. Cl.
CPC .......... *H04N 25/65* (2023.01); *H04N 25/709* (2023.01); *H04N 25/77* (2023.01); *H10K 39/32* (2023.02)

(58) Field of Classification Search
CPC ...... H04N 25/77; H04N 25/709; H04N 25/65; H04N 25/76; H04N 25/771; H10K 39/32; H10F 39/12
See application file for complete search history.

(56) References Cited

U.S. PATENT DOCUMENTS

2011/0134264 A1* 6/2011 Nishihara ............. H10F 39/014
  348/222.1
2014/0027618 A1    1/2014 Goto
  (Continued)

FOREIGN PATENT DOCUMENTS

JP    2012-209342    10/2012
JP    2016-076921    5/2016
  (Continued)

OTHER PUBLICATIONS

International Search Report of PCT application No. PCT/JP2022/004158 dated May 10, 2022.

*Primary Examiner* — Marly S Camargo
(74) *Attorney, Agent, or Firm* — Rimon P.C.

(57) ABSTRACT

An imaging device includes a semiconductor substrate and a first transistor provided on the semiconductor substrate and including a first gate electrode, a source, and a drain. The semiconductor substrate includes a first well region of a second conductivity type, a second well region of a first conductivity type different from the second conductivity type, a first impurity region of the first conductivity type, the first impurity region being positioned in the first well region, being one of the source and the drain, holding charges generated by photoelectric conversion, and being electrically connected to the first gate electrode, and a second impurity region of the second conductivity type, the second impurity region being positioned in the second well region and electrically connected to the other of the source and the drain.

18 Claims, 20 Drawing Sheets

(51) Int. Cl.
    *H04N 25/76*     (2023.01)
    *H04N 25/77*     (2023.01)
    *H10F 39/12*     (2025.01)
    *H10K 39/32*     (2023.01)

(56) References Cited

U.S. PATENT DOCUMENTS

| | | |
|---|---|---|
| 2016/0105622 A1 | 4/2016 | Tamaki |
| 2016/0190187 A1 | 6/2016 | Nishimura et al. |
| 2017/0214871 A1 | 7/2017 | Kanehara et al. |
| 2021/0273011 A1 | 9/2021 | Sato et al. |
| 2022/0208811 A1 | 6/2022 | Sato et al. |
| 2024/0155826 A1* | 5/2024 | Sato .................. H10F 39/12 |

FOREIGN PATENT DOCUMENTS

| | | |
|---|---|---|
| JP | 2016-127593 | 7/2016 |
| JP | 2017-135693 | 8/2017 |
| JP | 2020-188511 | 11/2020 |
| WO | 2020/170658 | 8/2020 |
| WO | 2021/059882 | 4/2021 |

* cited by examiner

IMAGING DEVICE AND METHOD FOR DRIVING THE SAME

BACKGROUND

1. Technical Field

The present disclosure relates to an imaging device and a method for driving the same.

2. Description of the Related Art

Charge-coupled device (CCD) image sensors and complementary metal oxide semiconductor (CMOS) image sensors are widely used in digital cameras and the like. These image sensors have photodiodes formed on a semiconductor substrate.

There has also been proposed a structure in which, instead of a photodiode, a photoelectric conversion layer is arranged above a semiconductor substrate. An imaging device having such a structure may be referred to as a stacked imaging device. In the stacked imaging device, charges generated by photoelectric conversion are temporarily stored as signal charges in an impurity region or the like formed in the semiconductor substrate. Subsequently, a signal corresponding to the number of charges stored is read through a CCD circuit or a CMOS circuit formed on the semiconductor substrate.

Japanese Patent Nos. 5449242 and 6213743 and Japanese Unexamined Patent Application Publication No. 2017-135693 describe examples of imaging devices.

SUMMARY

In one general aspect, the techniques disclosed here feature an imaging device including a semiconductor substrate and a first transistor provided on the semiconductor substrate and including a first gate electrode, a source, and a drain. The semiconductor substrate includes a first well region of a second conductivity type, a second well region of a first conductivity type different from the second conductivity type, a first impurity region of the first conductivity type, the first impurity region being positioned in the first well region, being one of the source and the drain, holding charges generated by photoelectric conversion, and being electrically connected to the first gate electrode, and a second impurity region of the second conductivity type, the second impurity region being positioned in the second well region and electrically connected to the other of the source and the drain.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
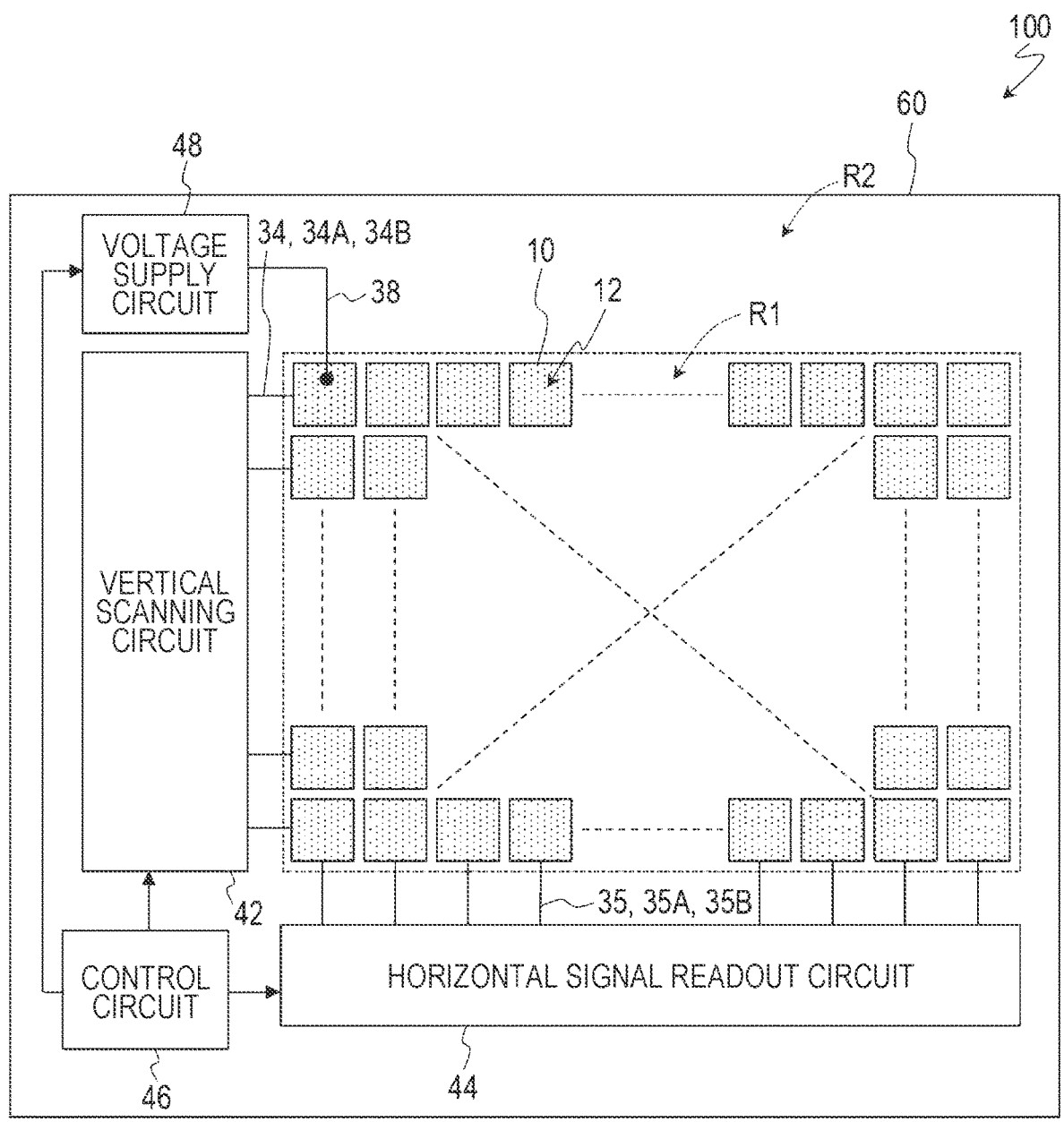
FIG. 1 is a schematic diagram illustrating an exemplary configuration of an imaging device according to a first embodiment.

Overview of One Aspect of the Present Disclosure

An imaging device according to the first aspect of the present disclosure includes
- a semiconductor substrate; and
- a first transistor provided on the semiconductor substrate and including a first gate electrode, a source, and a drain. The semiconductor substrate includes a first well region of a second conductivity type, a second well region of a first conductivity type different from the second conductivity type, a first impurity region of the first conductivity type, the first impurity region being positioned in the first well region, being one of the source and the drain, holding charges generated by photoelectric conversion, and being electrically connected to the first gate electrode, and a second impurity region of the second conductivity type, the second impurity region being positioned in the second well region and electrically connected to the other of the source and the drain.

The technology according to the first aspect is suitable for realizing a wide dynamic range imaging device that is less likely to fail even when receiving a large amount of light.

In the second aspect of the present disclosure according to the first aspect, for example, a first bias potential may be applied to the first well region, and a second bias potential different from the first bias potential may be applied to the second well region.

The configuration of the second aspect is a specific example of the configuration of the imaging device.

In the third aspect of the present disclosure according to the second aspect, for example, a potential of the second impurity region may change in accordance with generation of the charges, and a change in the potential of the second impurity region due to the generation of the charges may stop at a potential corresponding to the second bias potential.

The configuration of the third aspect is a specific example of the configuration of the imaging device.

In the fourth aspect of the present disclosure, for example, the imaging device according to any one of the first to third aspects may further include a first contact plug, a first contact hole, a second contact plug, and a second contact hole.

The first contact plug may be connected to the first impurity region through the first contact hole, the second contact plug may be connected to the second impurity region through the second contact hole, and in plan view, a distance between the second well region and the first contact hole may be greater than a distance between the first well region and the second contact hole.

The technology according to the fourth aspect is reasonable from the point of view of realizing a compact, high-resolution imaging device.

In the fifth aspect of the present disclosure, for example, the imaging device according to any one of the first to fourth aspects may further include a first contact plug, a first contact hole, a second contact plug, and a second contact hole.

The semiconductor substrate may further include a shallow trench isolation structure, the first contact plug may be connected to the first impurity region through the first contact hole, the second contact plug may be connected to the second impurity region through the second contact hole, and in plan view, the distance between the shallow trench isolation structure and the first contact hole may be greater than the distance between the shallow trench isolation structure and the second contact hole, The technology according to the fifth aspect is reasonable from the point of view of realizing a compact, high-resolution imaging device.

In the sixth aspect of the present disclosure, for example, the imaging device according to any one of the first to fifth aspects may further include a first contact plug, a first contact hole, a third contact plug, a third contact hole, and an amplification transistor provided on the semiconductor substrate and including a second gate electrode.

The amplification transistor may output an electric signal corresponding to a potential of the first impurity region, the first contact plug may be connected to the first impurity region through the first contact hole, the third contact plug may be connected to the second gate electrode through the third contact hole, and in plan view, the distance between the second well region and the first contact hole may be greater than the distance between the second well region and the third contact hole.

The technology according to the sixth aspect is advantageous from the point of view of realizing a high-resolution imaging device.

In the seventh aspect of the present disclosure, for example, the imaging device according to any one of the first to sixth aspects may further include a first contact plug, a first contact hole, a third contact plug, a third contact hole, and an amplification transistor provided on the semiconductor substrate and including a second gate electrode.

The semiconductor substrate may further include a shallow trench isolation structure, the amplification transistor may output an electric signal corresponding to a potential of the first impurity region, the first contact plug may be connected to the first impurity region through the first contact hole, the third contact plug may be connected to the second gate electrode through the third contact hole, and in plan view, the distance between the shallow trench isolation structure and the first contact hole may be greater than the distance between the shallow trench isolation structure and the third contact hole.

The technology according to the seventh aspect is advantageous from the point of view of realizing a high-resolution imaging device.

In the eighth aspect of the present disclosure, for example, the imaging device according to any one of the first to seventh aspects may further include a capacitive element electrically connected to the second impurity region.

The technology according to the eighth aspect is suitable for realizing a wide dynamic range imaging device.

In the ninth aspect of the present disclosure according to the eighth aspect, for example, the capacitive element may be a metal-insulator-metal capacitor.

The technology according to the ninth aspect is suitable for realizing a wide dynamic range imaging device.

In the tenth aspect of the present disclosure, for example, the imaging device according to any one of the first to third aspects may further include a first contact plug, a first contact hole, a second contact plug, a second contact hole, and a capacitive element electrically connected to the second impurity region.

The first contact plug may be connected to the first impurity region through the first contact hole, the second contact plug may be connected to the second impurity region through the second contact hole, and in plan view, the capacitive element may overlap at least one selected from the group consisting of the first contact hole and the second contact hole.

The technology according to the tenth aspect is advantageous from the point of view of realizing a high-resolution imaging device.

In the eleventh aspect of the present disclosure, for example, the imaging device according to any one of the first to tenth aspects may further include a reset transistor that resets a potential of the first impurity region to a reset potential.

The first transistor may be turned on when the potential of the first impurity region reaches a threshold potential, a second bias potential may be applied to the second well region, the potential of the first impurity region may stop changing when the potential of the first impurity region reaches a potential corresponding to the second bias potential, and the difference between the reset potential and the threshold potential may be smaller than the difference between the threshold potential and the second bias potential.

The technology according to the eleventh aspect is suitable for realizing a wide dynamic range imaging device.

In the twelfth aspect of the present disclosure, for example, the imaging device according to any one of the first to eleventh aspects may further include a reset transistor that resets a potential of the first impurity region to a reset potential.

The first transistor may be turned on when the potential of the first impurity region reaches a threshold potential, a second bias potential may be applied to the second well region, the potential of the first impurity region may stop changing when the potential of the first impurity region reaches a potential corresponding to the second bias potential, and the difference between the reset potential and the threshold potential may be greater than 10% of the difference between the threshold potential and the second bias potential.

The technology according to the twelfth aspect is suitable for avoiding a situation in which the image quality of the imaging device deteriorates due to noise derived from the second impurity region.

In the thirteenth aspect of the present disclosure, for example, the imaging device according to any one of the first to twelfth aspects may further include a photoelectric converter including a counter electrode, a pixel electrode, and a photoelectric conversion layer that is disposed between the counter electrode and the pixel electrode and that generates the charges.

The charges may be guided from the pixel electrode to the first impurity region, a portion including the photoelectric converter, the first transistor, the second impurity region, the first well region, and the second well region may be defined as a first pixel in the imaging device, and the first pixel may have a single-pixel electrode.

The technology according to the thirteenth aspect is suitable for realizing a fine imaging device.

In the fourteenth aspect of the present disclosure, for example, the imaging device according to any one of the first to thirteenth aspects may further include a microlens and a photoelectric converter.

Light may enter the photoelectric converter through the microlens, the photoelectric converter may generate the charges, a portion including the microlens, the photoelectric converter, the first transistor, the second impurity region, the first well region, and the second well region may be defined as a first pixel in the imaging device, and the microlens in the first pixel may have a single convex surface.

The technology according to the fourteenth aspect is suitable for realizing a fine imaging device.

An imaging device according to the fifteenth aspect of the present disclosure includes a first pixel provided on a semiconductor substrate; and a second pixel provided on the semiconductor substrate and adjacent to the first pixel.

Each of the first pixel and the second pixel includes a first transistor provided on the semiconductor substrate and including a first gate electrode, a source, and a drain, an amplification transistor provided on the semiconductor substrate and including a second gate electrode, a first well region of a second conductivity type, the first well region being positioned in the semiconductor substrate, a second well region of a first conductivity type different from the second conductivity type, the second well region being positioned in the semiconductor substrate, a first impurity region of the first conductivity type, the first impurity region being positioned in the first well region, being one of the source and the drain, holding charges generated by photoelectric conversion, and being electrically connected to the first gate electrode, a second impurity region of the second conductivity type, the second impurity region being positioned in the second well region and electrically connected to the other of the source and the drain, a first contact hole, a first contact plug connected to the first impurity region through the first contact hole, a third contact hole, and a third contact plug connected to the second gate electrode through the third contact hole.

The second well region of the first pixel, the first well region of the first pixel, the first well region of the second pixel, and the second well region of the second pixel are arranged in this order in a direction from the first pixel toward the second pixel in plan view.

The technology according to the fifteenth aspect is advantageous from the point of view of realizing a high-resolution imaging device.

A method for driving an imaging device according to the sixteenth aspect of the present disclosure is a method for driving an imaging device including a first transistor, a first PN junction, a second PN junction, and a third PN junction, the method including increasing a reverse bias voltage applied to the first PN junction by storing charges generated by photoelectric conversion when the first transistor is off;

turning on the first transistor by storing the charges; and applying a forward bias voltage to the second PN junction after reducing the reverse bias voltage applied to the second PN junction by storing the charges when the first transistor is on, and discharging the charges.

When the first transistor is on, the charges are stored in the third PN junction, and the second PN junction is connected to the third PN junction through wiring.

The technology according to the sixteenth aspect is suitable for realizing a wide dynamic range imaging device that is less likely to fail even when receiving a large amount of light.

In the seventeenth aspect of the present disclosure according to the sixteenth aspect, for example, the first PN junction may be a junction between a first well region of a second conductivity type positioned in a semiconductor substrate and a first impurity region of a first conductivity type different from the second conductivity type positioned in the first well region, the second PN junction may be a junction between a second well region of the first conductivity type positioned in the semiconductor substrate and a second impurity region of the second conductivity type positioned in the second well region, and the third PN junction may be a junction between the first well region and a third impurity region of the first conductivity type positioned in the first well region.

In the eighteenth aspect of the present disclosure according to the seventeenth aspect, for example, the first impurity region may be one of a source and a drain of the first transistor, and the third impurity region may be the other of the source and the drain of the first transistor.

In the following embodiments, ordinals such as first, second, third, . . . may be used. In a case where an ordinal is attached to a certain element, it is not essential that the same type of element with a smaller ordinal exists. The number of an ordinal can be changed as necessary.

In the following embodiments, the term "leakage current" may be used. The leakage current may also be referred to as dark current.

In the embodiments, "plan view" refers to a view in the thickness direction of the semiconductor substrate.

The polarities of the transistors and the conductivity types of the impurity regions in the following embodiments are examples. As long as there is no contradiction, the polarities of the transistors and the conductivity types of the impurity regions may be reversed.

In the following embodiments, "source" may be read as "drain" and "drain" may be read as "source". For example, which one of the two impurity regions of a field effect transistor (FET) corresponds to the source and drain may be determined by the polarity of the FET and the level of potential at that time. Therefore, which is the source and which is the drain may vary depending on the operating state of the FET.

Comprehensive or specific aspects may be implemented as an element, a device, a module, a system, or a method. In addition, comprehensive or specific aspects may be implemented by any desired combination of an element, a device, a module, a system, and a method.

Additional benefits and advantages of the disclosed embodiments may be individually obtained by the various embodiments and features, which need not all be provided in order to obtain one or more of such benefits and/or advantages.

Hereinafter, embodiments of the present disclosure will be described in detail with reference to the drawings. Note that any of the embodiments described below represents a general or specific example. The numerical values, shapes, materials, constituents, arrangement and forms of connection of the constituents, steps, the orders of the steps, and the like described in the following embodiments are examples, and are not intended to limit the present disclosure. Various aspects described herein can be combined with one another as long as such combination does not cause discrepancy. In addition, among constituents in the following embodiments, constituents not recited in any of the independent claims each defining the most generic concept are described as optional constituents. In the following description, constituents having substantially the same functions are denoted by the same reference signs and duplicate descriptions may be omitted. Also, illustrations of some elements may be omitted to avoid excessively complicating the drawings.

Various elements illustrated in the drawings are only schematically illustrated for understanding the present disclosure, and the dimensional ratios, appearances, and the like may be different from actual ones. That is, the drawings are schematic and not necessarily to scale. Therefore, for example, the scales and the like do not necessarily match between the drawings.

First Embodiment

FIG. 1 is a schematic diagram illustrating an exemplary configuration of an imaging device 100 according to a first embodiment. The imaging device 100 has a plurality of pixels 10 and peripheral circuits formed on a semiconductor substrate 60.

Each pixel 10 includes a photoelectric converter 12. The photoelectric converter 12 generates positive and negative charges by receiving light. The positive and negative charges are typically hole-electron pairs. In this embodiment, the photoelectric converter 12 is a photoelectric conversion structure including a photoelectric conversion layer disposed above the semiconductor substrate 60. In this embodiment, the photoelectric converter 12 can be read as a photoelectric conversion structure. However, the photoelectric converter 12 may be a photodiode formed on the semiconductor substrate 60.

In FIG. 1, the photoelectric converters 12 of the respective pixels 10 are illustrated spatially spaced apart from each other. However, this is merely for convenience of explanation. The photoelectric converters 12 of a plurality of pixels 10 may be continuously arranged on the semiconductor substrate 60 without being spaced apart from each other.

In the example illustrated in FIG. 1, the pixels 10 are arranged in a plurality of rows (m rows) and columns (n columns). Here, m and n independently represent an integer greater than or equal to 1. The pixels 10 form an imaging region R1 by being arranged two-dimensionally, for example, on the semiconductor substrate 60.

The number and arrangement of the pixels 10 are not limited to those in the illustrated example. For example, in this example, the center of each pixel 10 is positioned at a lattice point of a square lattice. However, the plurality of pixels 10 may be arranged such that the center of each pixel 10 is positioned at a lattice point of a triangular lattice, a hexagonal lattice, or the like, for example. The imaging device 100 may also be used as a line sensor by arranging the pixels 10 one-dimensionally. The number of pixels 10 included in the imaging device 100 may be one.

In the configuration illustrated in FIG. 1, the peripheral circuits include a vertical scanning circuit 42 and a horizontal signal readout circuit 44. As illustrated in FIG. 1, the peripheral circuits may additionally include a control circuit 46 and a voltage supply circuit 48. The peripheral circuits may further include a signal processing circuit, an output circuit, and the like. In the example illustrated in FIG. 1, each circuit included in the peripheral circuits is provided on the semiconductor substrate 60. However, some of the peripheral circuits may be arranged on another substrate different from the semiconductor substrate 60 on which the pixels 10 are formed.

The vertical scanning circuit 42 is also referred to as a row scanning circuit. The vertical scanning circuit 42 is connected to an address signal line 34 provided for each row of the plurality of pixels 10. As will be described later, the signal line provided for each row of the plurality of pixels 10 is not limited to the address signal line 34. A plurality of types of signal lines can be connected to the vertical scanning circuit 42 for each row of the plurality of pixels 10. The horizontal signal readout circuit 44 is also referred to as a column scanning circuit. The horizontal signal readout circuit 44 is connected to a vertical signal line 35 provided for each column of the plurality of pixels 10.

The control circuit 46 controls the entire imaging device 100 by receiving instruction data, clocks, and the like given from the outside of the imaging device 100, for example. Typically, the control circuit 46 has a timing generator. The control circuit 46 supplies drive signals to the vertical scanning circuit 42, the horizontal signal readout circuit 44, the voltage supply circuit 48, and the like. The arrows extending from the control circuit 46 in FIG. 1 schematically represent the flow of output signals from the control circuit 46. The control circuit 46 may be implemented by a microcontroller or one or more processors, for example. The microcontroller may include one or more processors. The functions of the control circuit 46 may be realized by a combination of a general-purpose processing circuit and software, or by hardware specialized for such processing.

The voltage supply circuit 48 supplies a predetermined voltage to each pixel 10 through a voltage line 38. The voltage supply circuit 48 is not limited to a specific power supply circuit. The voltage supply circuit 48 may be a circuit that converts a voltage supplied from a power source such as a battery into a predetermined voltage, or may be a circuit that generates a predetermined voltage. The voltage supply circuit 48 may be part of the vertical scanning circuit 42 described above. As schematically illustrated in FIG. 1, these circuits included in the peripheral circuits are arranged in a peripheral region R2 outside the imaging region R1.

Figure 2:
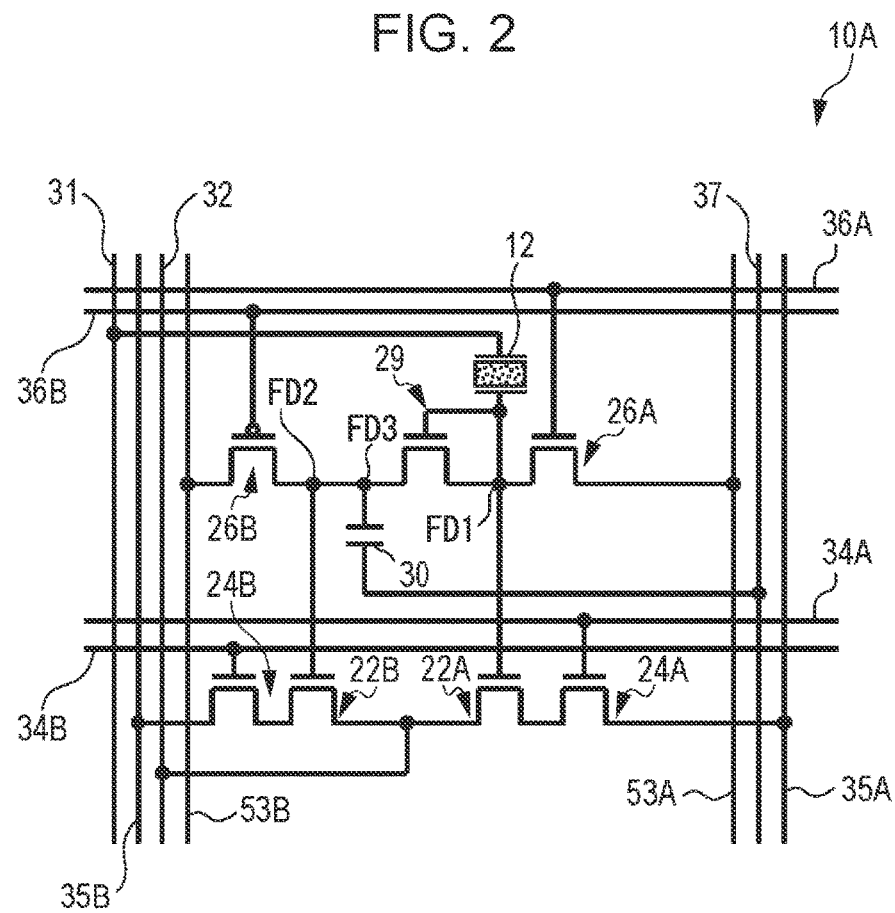
FIG. 2 is a schematic diagram illustrating an exemplary circuit configuration of a pixel in the imaging device according to the first embodiment.

FIG. 2 is a schematic diagram illustrating an exemplary circuit configuration of the pixel 10 in the imaging device 100 according to the first embodiment. In FIG. 2, one pixel 10A is illustrated as a representative to avoid complicating the drawing. The pixel 10A is an example of the pixel 10 illustrated in FIG. 1. The pixel 10A has a photoelectric converter 12. The pixel 10A also includes a signal detection circuit electrically connected to the photoelectric converter 12. As will be described in detail later with reference to the drawings, the photoelectric converter 12 includes a photoelectric conversion layer disposed above the semiconductor substrate 60. More specifically, here, a stacked imaging device is illustrated as the imaging device 100.

The photoelectric converter 12 is supported by the semiconductor substrate 60. The photoelectric converter 12 is connected to a storage control line 31. A predetermined potential Vim is applied to the storage control line 31 when the imaging device 100 is in operation. For example, when positive charges are used as signal charges among positive and negative charges generated by photoelectric conversion, the potential V ITO applied to the storage control line 31 when the imaging device 100 is in operation is a positive potential of about 10 V, for example. A case where holes are used as signal charges will be described below.

The pixel 10A includes a first amplification transistor 22A, a first address transistor 24A, a first reset transistor 26A, a first transistor 29 as a protection transistor, a second amplification transistor 22B, a second address transistor 24B, a second reset transistor 26B, and a capacitive element 30. The transistors 22A, 24A, 26A, 29, 22B, 24B, and 26B are provided on the semiconductor substrate 60. In this embodiment, the semiconductor substrate 60 is a silicon substrate.

In this embodiment, the transistors 22A, 24A, 26A, 29, 22B, 24B, and 26B are field effect transistors (FETs). To be more specific, the transistors 22A, 24A, 26A, 29, 22B, 24B, and 26B are metal oxide semiconductor FETs (MOSFETs).

In this embodiment, the first amplification transistor 22A, the first address transistor 24A, the first reset transistor 26A, the first transistor 29, the second amplification transistor 22B, and the second address transistor 24B are N-type transistors. To be more specific, the transistors 22A, 24A, 26A, 29, 22B, and 24B are N-type MOSFETs, that is, NMOS s. On the other hand, the second reset transistor 26B is a P-type transistor. To be more specific, the second reset transistor 26B is a P-type MOSFET, that is, a PMOS.

The first amplification transistor 22A has its gate electrode 22Ae electrically connected to the photoelectric converter 12. By applying the predetermined potential VITO to the storage control line 31 during operation, holes, for example, can be stored as signal charges in a charge storage node. Here, the charge storage node is a node electrically connected to the gate electrode 22Ae of the first amplification transistor 22A and the photoelectric converter 12. The charge storage node partially includes an impurity region formed in the semiconductor substrate 60. The charge storage node has a function to temporarily hold charges generated by the photoelectric converter 12.

In the pixel 10A, a first charge storage section FD1, which is an example of a first impurity region, and a second charge storage section FD2 and a third charge storage section FD3, which are examples of a second impurity region, are provided. The charge storage sections FD1, FD2, and FD3 are included in the charge storage node. The charge storage sections FD1 to FD3 have a function to temporarily hold charges.

In this embodiment, the first charge storage section FD1 is one of the source and drain of the first transistor 29 that is the protection transistor. The first charge storage section FD1 is also one of the source and drain of the first reset transistor 26A. The third charge storage section FD3 is the other of the source and drain of the first transistor 29. The second charge storage section FD2 is one of the source and drain of the second reset transistor 26B.

Light enters the photoelectric converter 12 through a microlens 13, which is not illustrated in FIG. 2. When the photoelectric converter 12 performs photoelectric conversion, charges generated by the photoelectric conversion flow to the first charge storage section FD1, and the charges are stored in the first charge storage section FD1. The first charge storage section FD1 is electrically connected to a gate electrode 29e of the first transistor 29 that is the protection transistor. When the potential of the first charge storage section FD1 reaches a threshold potential $V_{OF}$ with an increase in the charges stored in the first charge storage section FD1, the first transistor 29 is turned on (turn-on). Accordingly, the charges in the first charge storage section FD1 flow to the second charge storage section FD2, the third charge storage section FD3, and the capacitive element 30. Note that the threshold potential $V_{OF}$ is a potential that is dependent on a threshold voltage of the first transistor 29. In this context, the threshold voltage refers to a gate-source voltage of a transistor when drain current starts to flow through the transistor.

In this embodiment, the capacitive element 30 is a metal-insulator-metal (MIM) capacitor. "M" in MIM represents at least one of a metal or a metal compound. "I" in MIM represents an insulator, such as an oxide. That is, MIM is a concept that includes metal oxide metal (MOM). The MIM capacitor can realize the capacitive element 30 with high capacity density. Particularly, the use of an insulating material with a high dielectric constant as the insulator makes it easier to realize the capacitive element 30 with high capacity density.

The capacitive element 30 has one end electrically connected to the second and third charge storage sections FD2 and FD3. The capacitive element 30 has the other end electrically connected to a capacitive terminal line 37. A potential $V_{ss}$ is applied to the other end of the capacitive element 30 through the capacitive terminal line 37. In this embodiment, the potential $V_{ss}$ is a fixed potential.

One of the source and drain of the first amplification transistor 22A and one of the source and drain of the second amplification transistor 22B are connected to a power supply wiring line 32. When the imaging device 100 is in operation, a power supply potential $V_{DD}$ of about 3.3 V, for example, is supplied from the power supply wiring line 32 to one of the source and drain of each of the first and second amplification transistors 22A and 22B.

The other of the source and drain of the first amplification transistor 22A is connected to a first output line 35A through the first address transistor 24A. The other of the source and drain of the second amplification transistor 22B is connected to a second output line 35B through the second address transistor 24B. The vertical signal line 35 illustrated in FIG. 1 collectively represents the first and second output lines 35A and 35B.

The power supply potential $V_{DD}$ is supplied to one of the source and drain of the first amplification transistor 22A. Thus, the first amplification transistor 22A outputs an electric signal corresponding to the potential of the first charge storage section FD1 to the first output line 35A through the first address transistor 24A. This electric signal is specifically a voltage signal. The power supply potential $V_{DD}$ is supplied to one of the source and the drain of the second amplification transistor 22B. Thus, the second amplification transistor 22B outputs an electric signal corresponding to the potential of the second charge storage section FD2 to the second output line 35B through the second address transistor 24B. This electric signal is specifically a voltage signal.

The first address transistor 24A is connected between the first amplification transistor 22A and the first output line 35A. A first address line 34A is connected to a gate electrode 24Ae of the first address transistor 24A. The second address transistor 24B is connected between the second amplification transistor 22B and the second output line 35B. A second address line 34B is connected to a gate electrode 24Be of the second address transistor 24B. The address signal line 34 illustrated in FIG. 1 collectively represents the first and second address lines 34A and 34B.

The vertical scanning circuit 42 applies a row selection signal to the first address line 34A to control turning on and off of the first address transistor 24A. Thus, the output from the first amplification transistor 22A of the selected pixel 10A can be read to the first output line 35A. The vertical scanning circuit 42 applies a row selection signal to the second address line 34B to control turning on and off of the second address transistor 24B. Thus, the output from the second amplification transistor 22B of the selected pixel 10A can be read to the second output line 35B.

The arrangement of the first address transistor 24A and the arrangement of the second address transistor 24B are not limited to those in the example illustrated in FIG. 2. The first address transistor 24A may be arranged between one of the source and drain of the first amplification transistor 22A and the power supply wiring line 32. The second address transistor 24B may be arranged between one of the source and drain of the second amplification transistor 22B and the power supply wiring line 32.

Figure 3:
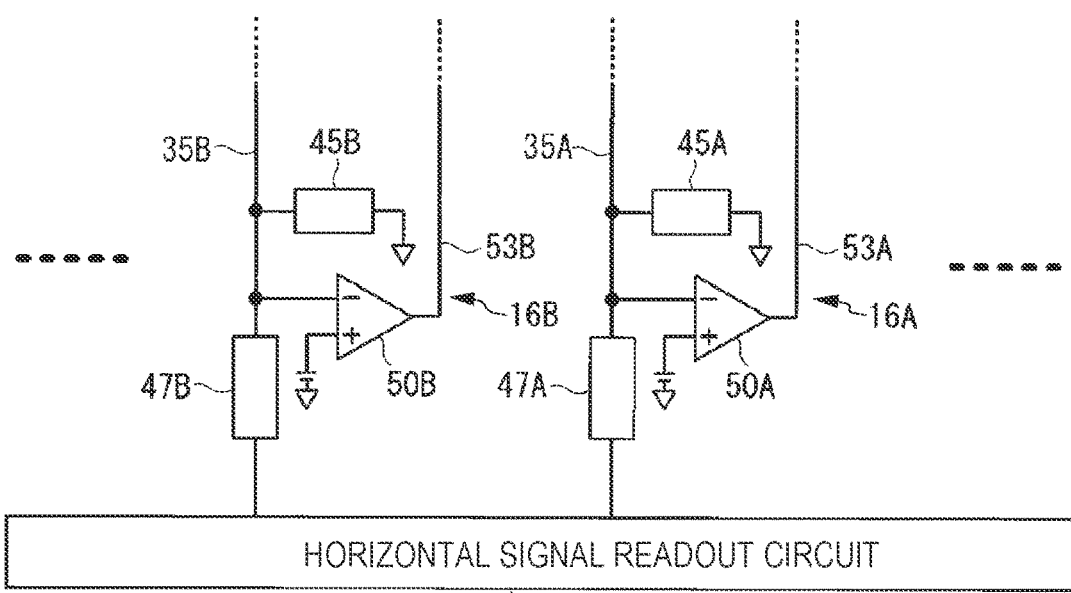
FIG. 3 is a schematic diagram illustrating an exemplary circuit configuration of a part subsequent to the pixel.

FIG. 3 is a schematic diagram illustrating an exemplary circuit configuration of a part subsequent to the pixel 10A. The first output line 35A is connected to a first load circuit 45A and a first column signal processing circuit 47A. The first load circuit 45A forms a source follower circuit together with the first amplification transistor 22A. The first column signal processing circuit 47A performs noise suppression signal processing, analog-digital conversion, and the like. Likewise, the second output line 35B is connected to a second load circuit 45B and a second column signal processing circuit 47B. The second load circuit 45B forms a source follower circuit together with the second amplification transistor 22B. The second column signal processing circuit 47B performs noise suppression signal processing, analog-digital conversion, and the like. The column signal processing circuits 47A and 47B are also referred to as row signal storage circuits. The noise suppression signal processing by the column signal processing circuits 47A and 47B is, for example, correlated double sampling.

The column signal processing circuits 47A and 47B are connected to the horizontal signal readout circuit 44. In this embodiment, the horizontal signal readout circuit 44 is connected to a first horizontal signal line and a second horizontal signal line (not illustrated). The horizontal signal readout circuit 44 reads a signal from the first column signal processing circuit 47A to the first horizontal signal line, and reads a signal from the second column signal processing circuit 47B to the second horizontal signal line. In this way, the signal that has passed through the first column signal processing circuit 47A and the signal that has passed through the second column signal processing circuit 47B can be read in parallel. This is advantageous from the point of view of reading these signals in a short time. However, it is also possible to employ a configuration in which a horizontal common signal line (not illustrated) is connected to the horizontal signal readout circuit 44, and the horizontal signal readout circuit 44 sequentially reads signals from the column signal processing circuits 47A and 47B to the horizontal common signal line.

The first load circuit 45A is provided for each column of a plurality of pixels 10A. The same applies to the second load circuit 45B, the first column signal processing circuit 47A, and the second column signal processing circuit 47B. The load circuits 45A and 45B and the column signal processing circuits 47A and 47B may be part of the peripheral circuits described above.

The vertical scanning circuit 42 is connected to a gate electrode 26Ae of the first reset transistor 26A through a first reset line 36A. The first reset line 36A is provided for each row of the plurality of pixels 10A, as in the case of the first and second address lines 34A and 34B. The vertical scanning circuit 42 can select the pixels 10A to be reset on a row-by-row basis by applying a row selection signal to the first address line 34A, and can turn on the first reset transistor 26A of the selected row by applying a reset signal to the gate electrode 26Ae of the first reset transistor 26A through the first reset line 36A. By turning on the first reset transistor 26A, the potential of the first charge storage section FD1 is reset.

The vertical scanning circuit 42 is connected to a gate electrode 26Be of the second reset transistor 26B through a second reset line 36B. The second reset line 36B is provided for each row of the plurality of pixels 10A, as in the case of the first reset line 36A. The vertical scanning circuit 42 can select the pixels 10A to be reset on a row-by-row basis by applying a row selection signal to the second address line 34B, and can turn on the second reset transistor 26B of the selected row by applying a reset signal to the gate electrode 26Be of the second reset transistor 26B through the second reset line 36B. By turning on the second reset transistor 26B, the potential of the second charge storage section FD2 is reset. In this embodiment, the potentials of the third charge storage section FD3 and the capacitive element 30 are reset along with the potential of the second charge storage section FD2.

In this example, one of the drain and source of the first reset transistor 26A is the first charge storage section FD1. The other of the drain and source of the first reset transistor 26A is electrically connected to a first feedback line 53A. In this example, the potential of the first feedback line 53A is supplied to the first charge storage section FD1 as a reset potential $V_{RES}$ for resetting the charges in the first charge storage section FD1.

Likewise, one of the drain and source of the second reset transistor 26B is the second charge storage section FD2. The other of the drain and source of the second reset transistor 26B is electrically connected to a second feedback line 53B. In this example, the potential of the second feedback line 53B is supplied to the second charge storage section FD2 as a reset potential for resetting the charges in the second charge storage section FD2.

As illustrated in FIG. 3, the imaging device 100 has a first feedback circuit 16A including a first inverting amplifier 50A as part of a feedback path. The first feedback line 53A is connected to an output terminal of the first inverting amplifier 50A. The imaging device 100 has a second feedback circuit 16B including a second inverting amplifier 50B as part of the feedback path. The second feedback line 53B is connected to an output terminal of the second inverting amplifier 50B.

An inverting input terminal of the first inverting amplifier 50A is connected to the first output line 35A. A first reference potential Vref1 is supplied to a non-inverting input terminal of the first inverting amplifier 50A when the imaging device 100 is in operation. The first reference potential Vref1 is, for example, a positive potential of 1 V or around 1 V. By turning on the first address transistor 24A and the first reset transistor 26A, a feedback path for negative feedback of the output from the first output line 35A can be formed. By forming the feedback path, the potential of the first output line 35A converges to the first reference potential Vref1 inputted to the non-inverting input terminal of the first inverting amplifier 50A. In other words, the formation of the feedback path resets the potential of the first charge storage section FD1 to a potential that sets the potential of the first output line 35A to Vref1. As the first reference potential Vref1, any potential within the range between the power supply potential $V_{DD}$ and the ground potential can be used.

The formation of the feedback path makes it possible to reduce reset noise generated when the first reset transistor 26A is turned off.

An inverting input terminal of the second inverting amplifier 50B is connected to the second output line 35B. A second reference potential Vref2 is supplied to a non-inverting input terminal of the second inverting amplifier 50B when the imaging device 100 is in operation. In this embodiment, the second reference potential Vref2 is a positive potential higher than the first reference potential Vref1. By turning on the second address transistor 24B and the second reset transistor 26B, a feedback path for negative feedback of the output from the second output line 35B can be formed. By forming the feedback path, the potential of the second output line 35B converges to the second reference potential Vref2 inputted to the non-inverting input terminal of the second inverting amplifier 50B. In other words, the formation of the feedback path resets the potential of the second charge storage section FD2 to a potential that sets the potential of the second output line 35B to Vref2. As the second reference potential Vref2, any potential within the range between the power supply potential $V_{DD}$ and the ground potential can be used. The formation of the feedback path makes it possible to reduce reset noise generated when the second reset transistor 26B is turned off.

The first inverting amplifier 50A is provided for each column of the plurality of pixels 10A. The same applies to the second inverting amplifier 50B, the first feedback line 53A, the second feedback line 53B, the first feedback circuit 16A, and the second feedback circuit 16B. The inverting amplifiers 50A and 50B may be part of the peripheral circuits described above.

As can be understood from the above description, a column feedback circuit is configured in this embodiment. The reset noise can be suppressed by feedback.

Figure 4:
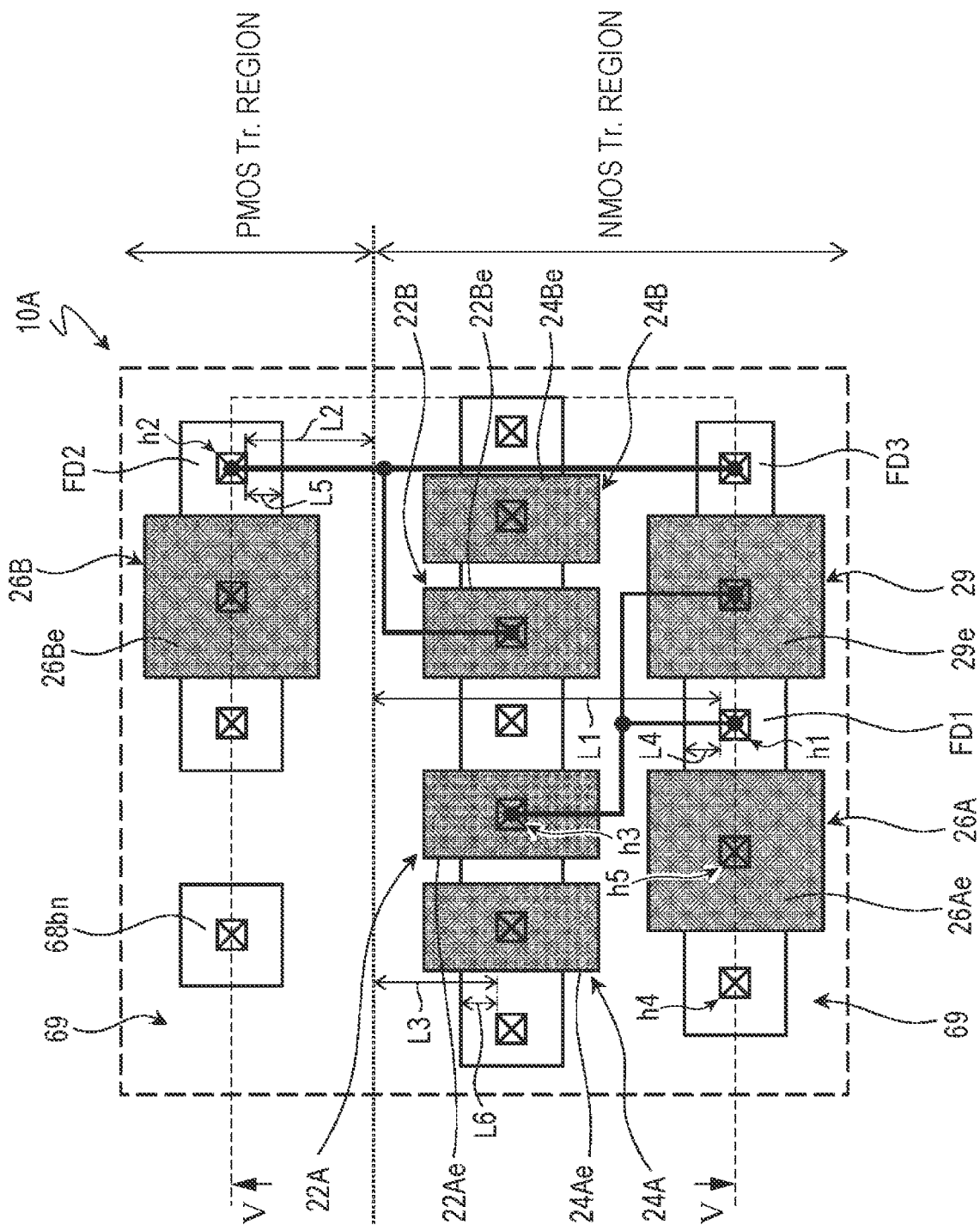
FIG. 4 is a schematic plan view illustrating an example layout of elements in the pixel according to the first embodiment.
Figure 5:
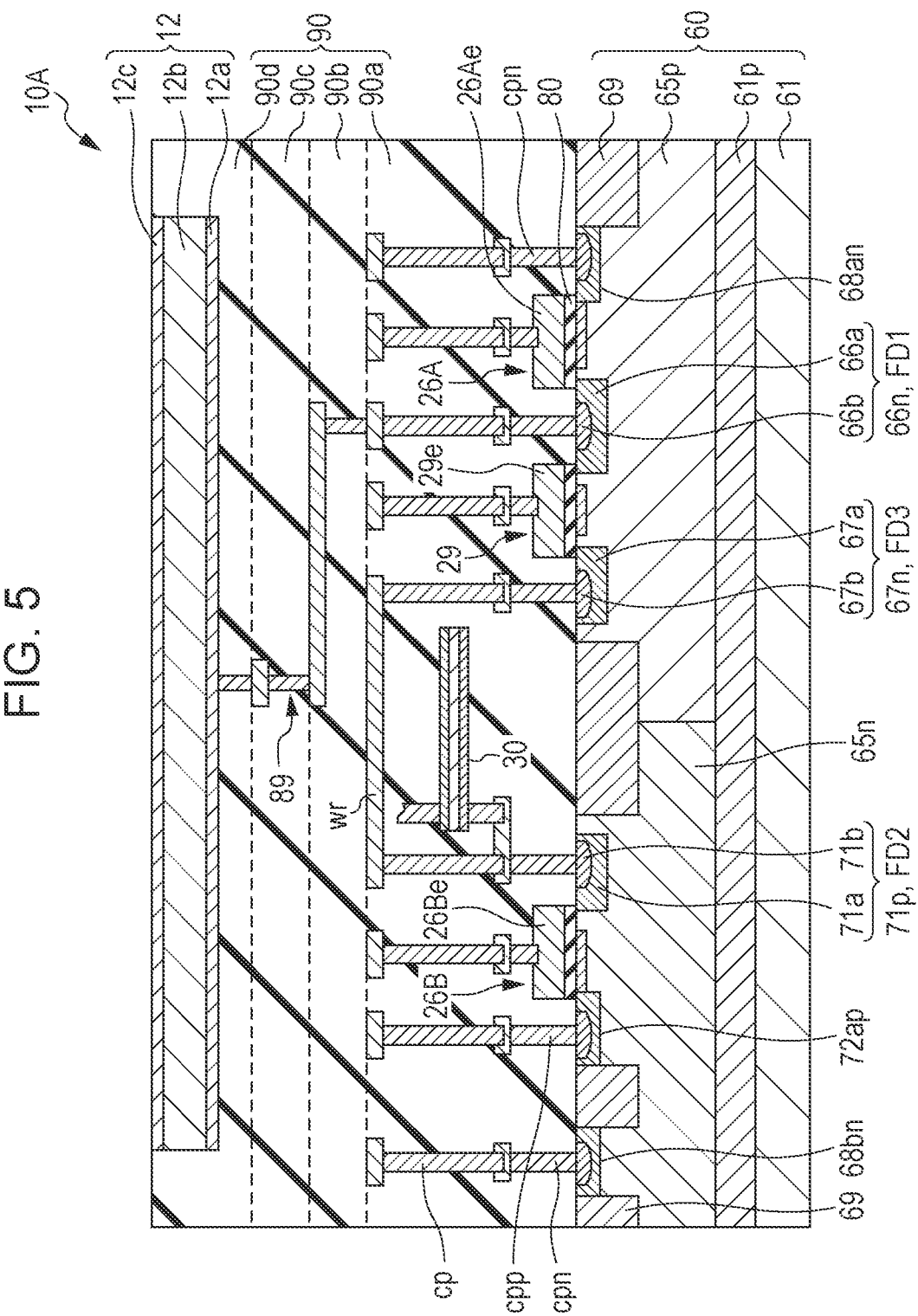
FIG. 5 is a sectional view taken along line V-V, schematically illustrating the configuration of the pixel according to the first embodiment.

FIG. 4 is a schematic plan view illustrating an example layout of elements in the pixel 10A according to the first embodiment. FIG. 5 is a sectional view schematically illustrating an arrangement of the elements in the pixel 10A illustrated in FIG. 4. The cross-section illustrated in FIG. 5 is obtained by cutting and expanding the pixel 10A along the broken line V-V in FIG. 4.

The pixel 10A generally includes the semiconductor substrate 60, the photoelectric converter 12, and a conductive structure 89. The photoelectric converter 12 is arranged above the semiconductor substrate 60. The photoelectric converter 12 is supported by an interlayer insulating layer 90. The interlayer insulating layer 90 covers the semiconductor substrate 60. The conductive structure 89 is disposed inside the interlayer insulating layer 90.

The interlayer insulating layer 90 includes a plurality of insulating layers. A plurality of wiring layers include a first wiring layer and a second wiring layer. The first wiring layer includes the address lines 34A and 34B, the reset lines 36A and 36B, and the like. The second wiring layer includes the output lines 35A and 35B, the power supply wiring line 32, the feedback lines 53A and 53B, and the like. The number of insulating layers and the number of wiring layers in the interlayer insulating layer 90 are not limited to those in this example and can be set optionally.

The photoelectric converter 12 converts incident light into electric charges. The photoelectric converter 12 includes a pixel electrode 12a, a counter electrode 12c, and a photoelectric conversion layer 12b. The pixel electrode 12a is provided on the interlayer insulating layer 90. The counter electrode 12c is arranged on the light incident side of the pixel electrode 12a. The photoelectric conversion layer 12b is arranged between the pixel electrode 12a and the counter electrode 12c.

The photoelectric conversion layer 12b receives incident light through the counter electrode 12c and performs photoelectric conversion. The photoelectric conversion produces positive and negative charges. The photoelectric conversion layer 12b is typically provided continuously across a plurality of pixels 10A. The photoelectric conversion layer 12b is made of an organic material or an inorganic material. Examples of the inorganic material include amorphous silicon. The photoelectric conversion layer 12b may include a layer of organic material and a layer of inorganic material.

Typically, the counter electrode 12c is provided across the plurality of pixels 10A, as in the case of the photoelectric conversion layer 12b. Although not illustrated in FIG. 5, the counter electrode 12c is connected to the storage control line 31 described above. For example, when the imaging device 100 is in operation, the potential of the storage control line 31 is controlled to set the potential of the counter electrode 12c higher than the potential of the pixel electrode 12a. This allows the pixel electrode 12a to selectively collect the positive charges out of the positive and negative charges generated by photoelectric conversion. By providing the counter electrode 12c in the form of a single continuous layer across the plurality of pixels 10A, it is possible to collectively apply a predetermined potential to the counter electrodes 12c of the plurality of pixels 10A. The counter electrode 12c is a light-transmitting electrode. The counter electrode 12c is made of a transparent conductive material. Examples of transparent conductive material include an indium thin oxide (ITO). The term "light-transmitting" in this specification means that at least part of light having a wavelength that can be absorbed by the photoelectric conversion layer 12b is transmitted, and it is not essential to transmit light over the entire wavelength range of visible light.

The pixel electrode 12a is spatially separated from the pixel electrode 12a of another adjacent pixel 10A. Therefore, the pixel electrode 12a is electrically isolated from the pixel electrodes 12a of the other pixels 10A. The pixel electrode 12a is made of metal or metal nitride. Examples of metal include aluminum, copper, and the like. The pixel electrode 12a may be made of polysilicon or the like that is doped with an impurity to provide conductivity.

The conductive structure 89 includes a plurality of wiring lines, plugs cp, contact plugs cpn, and contact plugs cpp. The conductive structure 89 has one end connected to the pixel electrode 12a. The conductive structure 89 has the other end connected to a circuit element formed on the semiconductor substrate 60. Thus, the pixel electrode 12a of the photoelectric converter 12 and the circuit on the semiconductor substrate 60 are electrically connected to each other.

Typically, the plurality of wiring lines and the plugs cp are made of metal or metal compound. Examples of metal include copper, tungsten, and the like. Examples of metal compound include metal nitride and metal oxide. The contact plugs cpn and cpp are made of polysilicon. The contact plug cpn is an N-type contact plug. The N-type contact plug cpn is doped with phosphorus, for example. The contact plug cpp is a P-type contact plug. The P-type contact plug cpp is doped with boron, for example. In this embodiment, the contact plugs cpn and cpp have bar-shaped portions.

The semiconductor substrate 60 includes a support substrate 61 and one or more semiconductor layers formed on the support substrate 61. Here, as the support substrate 61, a silicon substrate, specifically, a P-type silicon substrate is exemplified.

To be more specific, the semiconductor substrate 60 includes a P-type semiconductor region 61p, a first well region 65p that is a P-well region, a second well region 65n that is an N-well region, an impurity region 66n, an impurity region 67n, an impurity region 68an, an impurity region 68bn, an impurity region 71p, an impurity region 72ap, and an element isolation region 69.

The P-type semiconductor region 61p is arranged on the support substrate 61. The P-type semiconductor region 61p contains P-type impurities at a lower concentration than the support substrate 61.

The first well region 65p as the P-well region is a P-type impurity region. The first well region 65p is arranged on the P-type semiconductor region 61p. The first well region 65p contains P-type impurities. To be more specific, the first well region 65p contains P-type impurities at a concentration lower than that of the support substrate 61 and higher than that of the P-type semiconductor region 61p.

The second well region 65n as the N-well region is an N-type impurity region. The second well region 65n is arranged on the P-type semiconductor region 61p. The second well region 65n contains N-type impurities.

In FIG. 4, "NMOS Tr. region" is a region where the first well region 65p extends in plan view, while "PMOS Tr. region" is a region where the second well region 65n extends in plan view.

As illustrated in FIG. 5, an insulating layer 80 is provided on the semiconductor substrate 60. The insulating layer 80 serves as a gate insulating film for the first amplification transistor 22A, the first address transistor 24A, the first reset transistor 26A, the first transistor 29, the second amplification transistor 22B, the second address transistor 24B, and the second reset transistor 26B.

The first reset transistor 26A includes the impurity region 66n as one of the source and drain. The first reset transistor 26A includes the impurity region 68an as the other of the source and drain. The first reset transistor 26A includes the insulating layer 80 and the gate electrode 26Ae. The gate electrode 26Ae is provided on the insulating layer 80.

The first transistor 29 as the protection transistor includes the impurity region 66n as one of the source and drain. The first transistor 29 includes the impurity region 67n as the other of the source and drain. The first transistor 29 includes the insulating layer 80 and the gate electrode 29e. The gate electrode 29e is provided on the insulating layer 80.

The impurity region 66n is also the first charge storage section FD1. The impurity region 67n is also the third charge storage section FD3.

The second reset transistor 26B includes the impurity region 71p as one of the source and drain. The second reset transistor 26B includes the impurity region 72ap as the other of the source and drain. The second reset transistor 26B includes the insulating layer 80 and the gate electrode 26Be. The gate electrode 26Be is provided on the insulating layer 80.

The impurity region 71p is also the second charge storage section FD2.

The impurity regions 66n, 67n, 68an, and 68bn are N-type impurity regions. The impurity regions 71p and 72ap are P-type impurity regions.

The impurity region 66n is arranged in the first well region 65p. The impurity region 66n includes a first region 66a and a second region 66b. The second region 66b is provided in the first region 66a. The second region 66b has a higher impurity concentration than the first region 66a.

The impurity region 67n is arranged in the first well region 65p. The impurity region 67n includes a first region 67a and a second region 67b. The second region 67b is provided in the first region 67a. The second region 67b has a higher impurity concentration than the first region 67a.

The impurity region 71p is arranged in the second well region 65n. The impurity region 71p includes a first region 71a and a second region 71b. The second region 71b is provided in the first region 71a. The second region 71b has a higher impurity concentration than the first region 71a.

The impurity region 68an is arranged in the first well region 65p. The impurity region 68bn is arranged in the second well region 65n. The impurity region 72ap is arranged in the second well region 65n.

The impurity region 68bn forms a well-contact region of the second well region 65n. The potential of second well region 65n can be adjusted by applying a potential to the impurity region 68bn. Although not illustrated in FIG. 5, there is also an impurity region 68cp that forms a well-contact region of the first well region 65p. The impurity region 68cp is a P-type impurity region. The potential of the first well region 65p can be adjusted by applying a potential to the impurity region 68cp.

As in the case of the impurity regions 66n, 67n, and 71p, the impurity region 68an has a first region and a second region having a higher impurity concentration than the first region. The same also applies to the impurity regions 72ap, 68bn, and 68cp.

The first amplification transistor 22A, the first address transistor 24A, the first reset transistor 26A, the first transistor 29, the second amplification transistor 22B, and the second address transistor 24B are NMOSs. On the other hand, the second reset transistor 26B is a PMOS.

The element isolation region 69 electrically isolates the second reset transistor 26B as the PMOS from the first amplification transistor 22A, the first address transistor 24A, the first reset transistor 26A, the first transistor 29, the second amplification transistor 22B, and the second address transistor 24B, which are the NMOSs. In this embodiment, the element isolation region 69 has a shallow trench isolation (STI) structure. The STI structure may be formed in the semiconductor substrate 60 by an STI process. However, the element isolation region 69 may also be an implantation isolation region.

As illustrated in FIG. 4, the element isolation region 69 surrounds the first charge storage section FD1 in plan view. The element isolation region 69 surrounds the second charge storage section FD2 in plan view. The element isolation region 69 surrounds the third charge storage section FD3 in plan view.

The gate electrode 22Ae of the first amplification transistor 22A, the gate electrode 24Ae of the first address transistor 24A, the gate electrode 26Ae of the first reset transistor 26A, the gate electrode 29e of the first transistor 29, the gate electrode 22Be of the second amplification transistor 22B, and the gate electrode 24Be of the second address transistor 24B are gate electrodes doped with N-type impurities. On the other hand, the gate electrode 26Be of the second reset transistor 26B is a gate electrode doped with P-type impurities.

The interlayer insulating layer 90 includes a plurality of insulating layers 90a, 90b, and 90d. The number of insulating layers included in the interlayer insulating layer is not particularly limited.

The plurality of plugs cp, the plurality of contact plugs cpn, and the plurality of contact plugs cpp are arranged in the insulating layer 90a.

The plug cp, the contact plug cpn, and the impurity region 68an are electrically connected in this order. The plug cp, the contact plug cpp, and the impurity region 72ap are electrically connected in this order. The plug cp, the contact plug cpn, and the impurity region 68bn are electrically connected in this order. To be more specific, these contact plugs cpn or cpp are connected to the second region of the impurity region.

The plug cp, the contact plug cpn, and the gate electrode 26Ae are electrically connected in this order. The plug cp, the contact plug cpn, and the gate electrode 29e are electrically connected in this order. The plug cp, the contact plug cpp, and the gate electrode 26Be are electrically connected in this order.

The pixel electrode 12a, the plug cp, the contact plug cpn, and the impurity region 66n are electrically connected in this order. Therefore, the charges collected by the pixel electrode 12a are transmitted to the impurity region 66n through the plug cp and the contact plug cpn in this order. To be more specific, this contact plug cpn is connected to the second region 66b of the impurity region 66n.

The impurity region 67n, the contact plug cpn, the plug cp, the wiring line wr, the plug cp, the contact plug cpp, and the impurity region 71p are electrically connected in this order. To be more specific, the second region 67b of the impurity region 67n, the contact plug cpn, the plug cp, the wiring line wr, the plug cp, the contact plug cpp, and the second region 71b of the impurity region 71p are electrically connected in this order. PN junction formation is avoided by interposing the metal or metal compound plug cp between the contact plugs cpn and cpp having conductivity types opposite to each other. It is also possible to directly connect the contact plugs cpn and cpp while avoiding the PN junction formation, for example, by siliciding the junction between the contact plugs cpn and cpp.

Although not illustrated in FIG. 5, the insulating layer 80 is actually provided also in a region other than under the gate electrodes of the transistors 22A, 24A, 26A, 29, 22B, 24B, and 26B within the region on the semiconductor substrate 60. To be more specific, the insulating layer 80 extends in the form of a film in a region under the gate electrodes and in a region other than under the gate electrodes on the semiconductor substrate 60.

An insulating layer 85 is provided on the gate electrodes of the transistors 22A, 24A, 26A, 29, 22B, 24B, and 26B. To be more specific, the insulating layer 85 extends in the form of a film over a portion of the insulating layer 80 that extends in the region other than under the gate electrodes and over the gate electrodes.

The contact plug cpn is connected to the impurity region 68an through a contact hole. The contact plug cpp is connected to the impurity region 72ap through a contact hole. The contact plug cpn is connected to the impurity region 68bn through a contact hole. The contact plug cpn is connected to the gate electrode 26Ae through a contact hole. The contact plug cpn is connected to the gate electrode 29e through a contact hole. The contact plug cpp is connected to the gate electrode 26Be through a contact hole. The contact plug cpn is connected to the impurity region 66n through a contact hole. The contact plug cpn is connected to the impurity region 67n through a contact hole. The contact plug cpp is connected to the impurity region 71p through a contact hole.

There are also contact plugs cpn that are not illustrated in FIG. 5. The contact plug cpn is connected to the gate electrode 22Ae of the first amplification transistor 22A through a contact hole. The contact plug cpn is connected to the gate electrode 22Be of the second amplification transistor 22B through a contact hole. The contact plug cpn is connected to the gate electrode 24Ae of the first address transistor 24A through a contact hole. The contact plug cpn is connected to the gate electrode 24Be of the second address transistor 24B through a contact hole.

The contact holes through which the contact plugs cpn or cpp connected to the impurity regions 68an, 72ap, 68bn, 66n, 67n, and 71p pass are provided so as to pass through the insulating layers 80 and 85. The contact holes through which the contact plugs cpn or cpp connected to the gate electrodes 26Ae, 29e, 26Be, 22Ae, 22Be, 24Ae, and 24Be pass are provided so as to pass through the insulating layer 85.

FIG. 4 illustrates a first contact hole h1 through which the contact plug cpn connected to the impurity region 66n, that is, the first charge storage section FD1 passes. FIG. 4 illustrates a second contact hole h2 through which the contact plug cpp connected to the impurity region 71p, that is, the second charge storage section FD2 passes. FIG. 4 illustrates a third contact hole h3 through which the contact plug cpn connected to the gate electrode 22Ae passes. FIG. 4 illustrates a fourth contact hole h4 through which the contact plug cpn connected to the impurity region 68an passes. FIG. 4 illustrates a fifth contact hole h5 through which the contact plug cpn connected to the gate electrode 26Ae passes.

Figure 6:
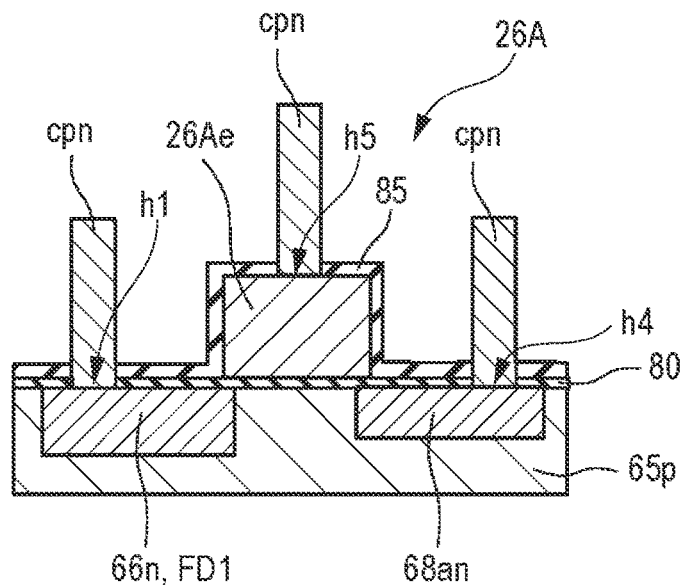
FIG. 6 is a sectional view schematically illustrating a structure of a first reset transistor and its periphery according to the first embodiment.

FIG. 6 is a sectional view schematically illustrating the structure of the first reset transistor 26A and its periphery according to the first embodiment. As illustrated in FIG. 6, the first contact hole h1 through which the contact plug cpn connected to the impurity region 66n passes is provided so as to pass through the insulating layers 80 and 85. The fourth contact hole h4 through which the contact plug cpn connected to the impurity region 68an passes is provided so as to pass through the insulating layers 80 and 85 Likewise, the contact holes through which the contact plugs cpn or cpp connected to the impurity regions 72ap, 68bn, 67n, and 71p pass are also provided so as to pass through the insulating layers 80 and 85.

As illustrated in FIG. 6, the fifth contact hole h5 through which the contact plug cpn connected to the gate electrode 26Ae passes is provided so as to pass through the insulating layer 85. Likewise, the contact holes through which the contact plugs cpn or cpp connected to the gate electrodes 29e, 26Be, 22Ae, 22Be, 24Ae, and 24Be pass are also provided so as to pass through the insulating layer 85.

Figure 7:
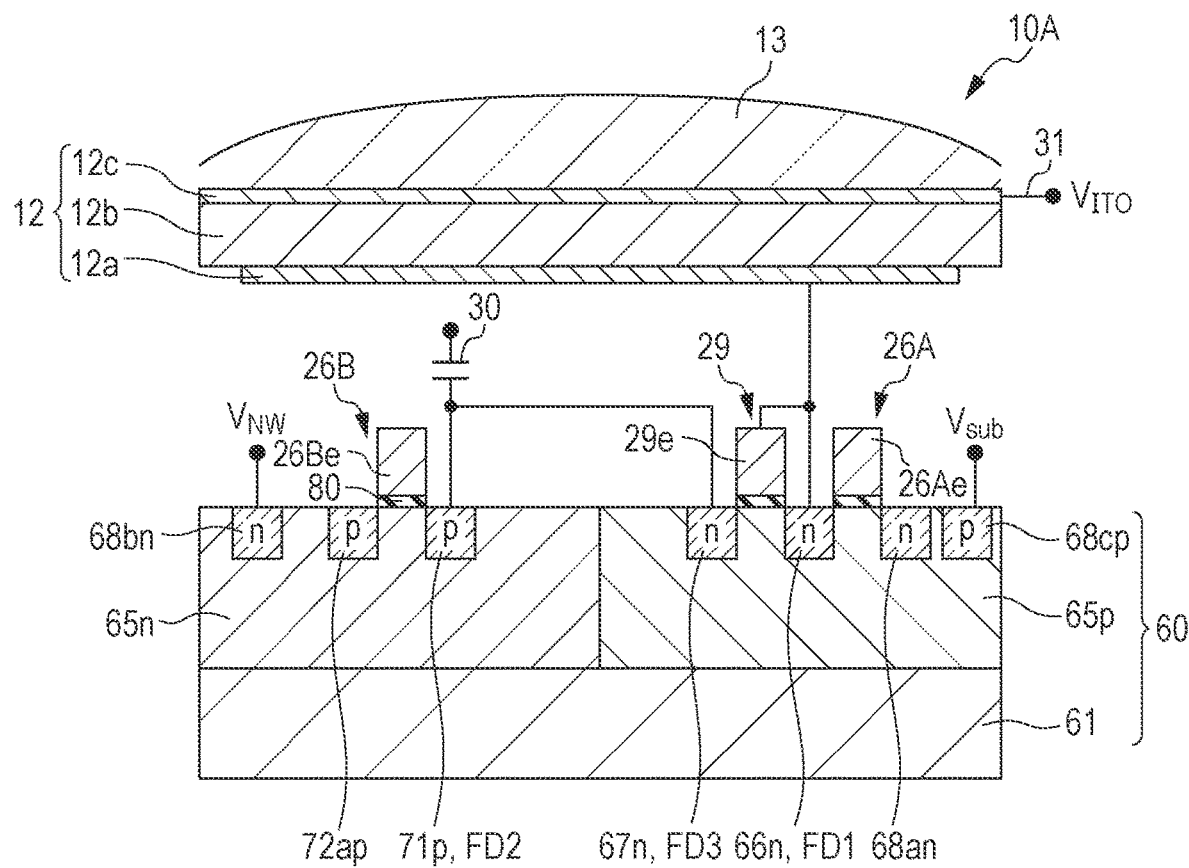
FIG. 7 is a sectional view schematically illustrating the pixel according to the first embodiment.
Figure 8:
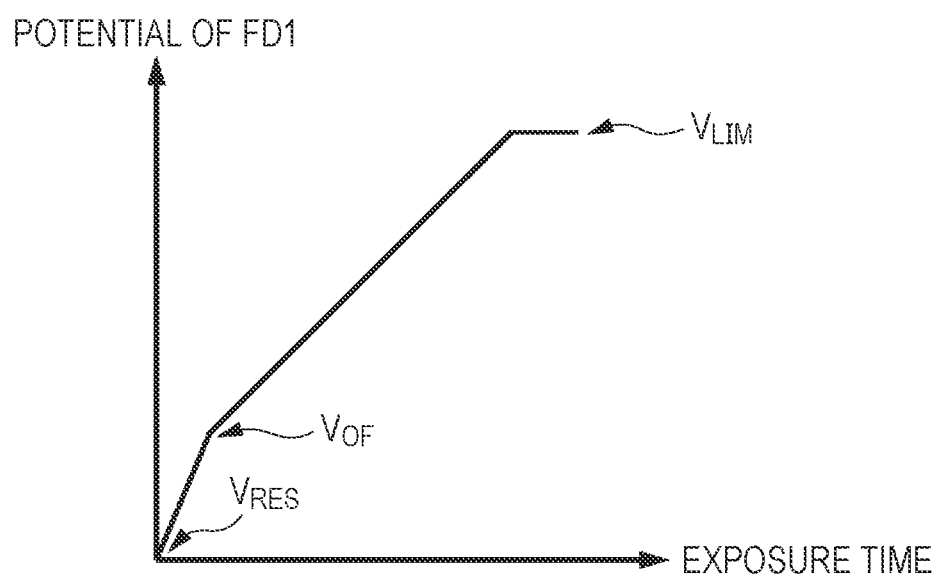
FIG. 8 is a graph schematically illustrating a relationship between exposure time of the imaging device and a potential of a first charge storage section according to the first embodiment.

With reference to FIGS. 7 and 8, a description is given below of changes in potential of the first charge storage section FD1 according to this embodiment. FIG. 7 is a sectional view schematically illustrating the pixel 10A according to the first embodiment. FIG. 7 illustrates the microlens 13 arranged on the photoelectric converter 12. FIG. 7 omits the illustration of the P-type semiconductor region 61p, the element isolation region 69, and the like. FIG. 8 is a graph schematically illustrating the relationship between the exposure time of the imaging device 100 and the potential of the first charge storage section FD1 according to the first embodiment.

In FIG. 7, the impurity region 68cp forms the well-contact region of the first well region 65p. A first bias potential $V_{sub}$ is applied to the impurity region 68cp. The first bias potential $V_{sub}$ is, for example, 0 V.

In FIG. 7, the impurity region 68bn forms the well-contact region of the second well region 65n. A second bias potential $V_{NW}$ is applied to the impurity region 68bn. The second bias potential $V_{NW}$ is, for example, 3.3 V.

The first charge storage section FD1 during exposure of the imaging device 100 will be described with reference to FIG. 8. The potential of the first charge storage section FD1 is reset to the reset potential $V_{RES}$ by a reset operation using the first reset transistor 26A. Then, as the exposure progresses, the charge storage in the first charge storage section FD1 progresses, and the potential of the first charge storage section FD1 rises.

When the potential of the first charge storage section FD1 reaches the threshold potential $V_{OF}$, the source-drain voltage of the first transistor 29 as the protection transistor reaches the threshold voltage, and the first transistor 29 is turned on (turn-on). Thus, the first charge storage section FD1 is electrically connected to the second charge storage section FD2, the third charge storage section FD3, and the capacitive element 30, and starts storing charges in cooperation therewith. In other words, the charge storage node has a larger capacity value after turn-on than before turn-on. Therefore, after turn-on, the slope of change in potential of the first charge storage section FD1 with respect to the exposure time is smaller than before turn-on.

The potential of the first charge storage section FD1 rises even after turn-on. The same applies to the potential of the second charge storage section FD2 electrically connected to the first charge storage section FD1. When the potential of the second charge storage section FD2 reaches a clipping potential $V_{CLIP}$, a forward bias voltage is applied to the PN junction between the second charge storage section FD2 and the second well region 65n as the N-well region, and charges are discharged from the second charge storage section FD2 to the second well region 65n. As a result, the rise in the potential of the first charge storage section FD1 stops. The clipping potential $V_{CLIP}$ is a potential dependent on the second bias potential $V_{NW}$.

The relationship between the second bias potential $V_{NW}$ and the clipping potential $V_{CLIP}$ will be described. A PN junction is formed between the second well region 65n and the second charge storage section FD2. A built-in potential $V_{bi}$ of the PN junction deviates the clipping potential $V_{CLIP}$ from the second bias potential $V_{NW}$. The built-in potential $V_{bi}$ takes a value according to the impurity concentration of the second well region 65n and the impurity concentration of the second charge storage section FD2. In the illustrated example, the clipping potential $V_{CLIP}$ is the sum of the second bias potential $V_{NW}$ and the built-in potential $V_{bi}$. In a strict sense, a PN junction current, that is, a current in a forward bias direction starts to flow when the potential of the second charge storage section FD2 becomes a potential near the second bias potential $V_{NW}$ due to the generation of charges, and subsequently the current gradually increases. Typically, the second bias potential $V_{NW}$ and the clipping potential $V_{CLIP}$ are approximately equal.

As can be understood from the description with reference to FIGS. 7 and 8, in the imaging device 100 according to this embodiment, the capacity value of the charge storage node is small in a dark scene. Therefore, high-sensitivity imaging is possible in a dark scene. On the other hand, the capacity value of the charge storage node is large in a bright scene. Therefore, high-saturation imaging is possible in a bright scene. For this reason, according to this embodiment, the imaging device 100 with a wide dynamic range can be realized.

In this embodiment, a reverse bias voltage applied to the PN junction between the first charge storage section FD1 and the first well region 65p as the P-well region is smaller when the storage of charges in the first charge storage section FD1 is not progressing. Therefore, a leakage current of the first charge storage section FD1 is smaller when the storage of charges in the first charge storage section FD1 is not progressing. This characteristic is advantageous from the point of view of performing high-sensitivity imaging in a dark scene. As a result, this characteristic can contribute to realizing the wide dynamic range imaging device 100.

In this embodiment, the potential of the first charge storage section FD1 is prevented from changing beyond a limit potential $V_{LIM}$. This makes it possible, together with the large capacity value of the charge storage node in a bright scene, to realize the imaging device 100 that is less likely to fail even when receiving a large amount of light.

The relationship between the potential of the first charge storage section FD1 and the potential of the second charge storage section FD2 will be described.

When the first transistor 29 as the protection transistor is on, a channel through which charges pass is formed between the source and drain of the first transistor 29. Resistance of this channel may be referred to as channel resistance. Due to an RC time constant, the potential of the second charge storage section FD2 can change with a delay with respect to the change in potential of the first charge storage section FD1. Thus, in a strict sense, there may be a difference between the potential of the first charge storage section FD1 and the potential of the second charge storage section FD2 due to the channel resistance and delay. Assuming that the channel resistance is zero, the potential of the first charge storage section FD1 and the potential of the second charge storage section FD2 can be treated as equal after a time sufficient for the RC time constant has passed.

In a strict sense, there may be a difference due to the channel resistance between the limit potential $V_{LIM}$ for the first charge storage section FD1 and the clipping potential $V_{CLIP}$ for the second charge storage section FD2. Assuming that the channel resistance is zero, this difference can be treated as zero.

This embodiment will be further described below using the terms including the first transistor 29, the first well region 65p, the second well region 65n, the first impurity region, the second impurity region, a first conductivity type, a second conductivity type, the first bias potential $V_{sub}$, and the second bias potential $V_{NW}$. The first transistor 29 corresponds to the protection transistor. The first well region 65p corresponds to the P-well region. The second well region 65n corresponds to the N-well region. The first impurity region corresponds to the first charge storage section FD1. The second impurity region corresponds to the second charge storage section FD2. The first conductivity type and the second conductivity type are conductivity types different from each other. To be more specific, the first conductivity type and the second conductivity type are conductivity types having polarities opposite to each other. In the above example, the first conductivity type is the N-type. The second conductivity type is the P-type. The first bias potential $V_{sub}$ and the second bias potential $V_{NW}$ are different from each other. Note that the use of common reference numerals is not intended to limit the interpretation of the present disclosure.

In this embodiment, the imaging device 100 includes the semiconductor substrate 60. The semiconductor substrate 60 is provided with the first transistor 29. The semiconductor substrate 60 has the first well region 65p, the second well region 65n, the first impurity region that is the first charge storage section FD1, and the second impurity region that is the second charge storage section FD2. The first well region 65p is a second conductivity type region. The second well region 65n is a first conductivity type region. The first impurity region is located in the first well region 65p. The first impurity region is one of the source and drain of the first transistor 29. The first impurity region holds charges generated by photoelectric conversion. The first impurity region is electrically connected to the gate electrode 29e of the first transistor 29. The first impurity region is a first conductivity type impurity region. The second impurity region is located in the second well region 65n. The second impurity region is electrically connected to the other of the source and drain of the first transistor 29. The second impurity region is a second conductivity type region. This configuration is suitable for realizing the wide dynamic range imaging device 100 which is less likely to fail even when receiving a large amount of light. According to this configuration, it is possible to switch focus between high sensitivity and high saturation, by turning on and off the first transistor 29 without depending on a control signal from outside. According to this configuration, even when the imaging device 100 has a plurality of pixels, it is possible to switch focus for each pixel between high sensitivity and high saturation.

In this embodiment, the first bias potential $V_{sub}$ is applied to the first well region 65p. The second bias potential $V_{NW}$ is applied to the second well region 65n. The application of the first bias potential $V_{sub}$ to the first well region 65p can stabilize the potential of the first well region 65p. The application of the second bias potential $V_{NW}$ to the second well region 65n can stabilize the potential of the second well region 65n. By applying the second bias potential $V_{NW}$ to the second well region 65n, the potential can be adjusted when the change in the potential of the second impurity region stops due to the generation of charges by photoelectric conversion.

In this embodiment, the first transistor 29 is turned on when the potential of the first impurity region that is the first charge storage section FD1 reaches the threshold potential $V_{OF}$. The threshold potential $V_{OF}$ is higher than one of the first bias potential $V_{sub}$ and the second bias potential $V_{NW}$ and lower than the other of the first bias potential $V_{sub}$ and the second bias potential $V_{NW}$. In one specific example, the threshold potential $V_{OF}$ is higher than the first bias potential $V_{sub}$ and lower than the second bias potential $V_{NW}$. However, the threshold potential $V_{OF}$ may be lower than the first bias potential $V_{sub}$ and higher than the second bias potential $V_{NW}$.

In this embodiment, the potential of the second impurity region that is the second charge storage section FD2 can change as charges are generated. Then, when the potential of the second impurity region reaches a potential corresponding to the second bias potential $V_{NW}$, the change in the potential of the second impurity region can stop.

The potential corresponding to the second bias potential $V_{NW}$ can be the clipping potential $V_{CLIP}$.

In a typical example, when the first transistor 29 is on, the first impurity region which is the first charge storage section FD1 and the second impurity region which is the second charge storage section FD2 are electrically connected. By applying the second bias potential $V_{NW}$ to the second well region 65n, the potential can be adjusted when the change in the potential of the first impurity region stops due to the generation of charges by photoelectric conversion. In this typical example, the potential of the first impurity region can change as charges are generated. Then, when the potential of the first impurity region reaches a potential corresponding to the second bias potential $V_{NW}$, the change in the potential of the first impurity region can stop.

In this embodiment, the imaging device 100 includes the impurity region 68cp which is a first well-contact region. The first well-contact region is a second conductivity type region. The first well-contact region is located in the first well region 65p. The first bias potential $V_{sub}$ is applied to the first well-contact region. Thus, the first bias potential $V_{sub}$ can be applied to the first well region 65p through the first well-contact region. Accordingly, the potential of the first well region 65p can be stabilized.

In this embodiment, the imaging device 100 includes the impurity region 68bn which is a second well-contact region. The second well-contact region is a first conductivity type region. The second well-contact region is located in the second well region 65n. The second bias potential $V_{NW}$ is applied to the second well-contact region. Thus, the second bias potential $V_{NW}$ can be applied to the second well region 65n through the second well-contact region. Accordingly, the potential of the second well region 65n can be stabilized. Thus, the potential can be adjusted when the change in potential of the second impurity region that is the second charge storage section FD2 stops due to the generation of charges by photoelectric conversion.

As illustrated in FIG. 4, in this embodiment, the imaging device 100 includes a first contact plug that is the contact plug cpn, the first contact hole h1, a second contact plug that is the contact plug cpp, the second contact hole h2, a third contact plug that is the contact plug cpn, and the third contact hole h3. The semiconductor substrate 60 is provided with the first amplification transistor 22A. The first amplification transistor 22A outputs an electric signal corresponding to the potential of the first impurity region which is the first charge storage section FD1. Typically, the source and drain of the first amplification transistor 22A are the first conductivity type impurity regions and are located in the first well region 65p. The first contact plug is connected to the first impurity region through the first contact hole. The second contact plug is connected to the second impurity region through the second contact hole. The third contact plug is connected to the gate electrode 22Ae of the first amplification transistor 22A through the third contact hole.

Here, the distance between the second well region 65n and the first contact hole h1 in plan view is defined as a distance L1. A distance between the first well region 65p and the second contact hole h2 in plan view is defined as a distance L2. The distance between the second well region 65n and the third contact hole h3 in plan view is defined as a distance L3. In FIG. 4 and the like, reference numeral L3 and corresponding arrows are illustrated at positions away from the third contact hole h3 because of space limitations. The same applies to the reference numeral L6.

The distances L1, L2, and L3 according to a typical example will be described. In the typical example, a PN junction is formed between the first well region 65p and the second well region 65n. The distance L1 is the distance between the PN junction and the first contact hole h1 in plan view. The distance L2 is the distance between the PN junction and the second contact hole h2 in plan view. The distance L3 is the distance between the PN junction and the third contact hole h3 in plan view.

In this embodiment, the semiconductor substrate 60 is provided with the element isolation region 69. The element isolation region 69 has an STI structure.

Here, the distance between the element isolation region 69 and the first contact hole h1 in plan view is defined as a distance L4. A distance between the element isolation region 69 and the second contact hole h2 in plan view is defined as a distance L5. A distance between the element isolation region 69 and the third contact hole h3 in plan view is defined as a distance L6.

In this embodiment, the distance L1 is greater than the distance L2. This configuration is reasonable from the point of view of realizing a compact, high-resolution imaging device 100. To be more specific, from the point of view of reducing the size of the pixel 10A, it is conceivable to reduce the sum of the distances L1 and L2. On the other hand, from the point of view of suppressing leakage current originating from the second well region 65n in the first impurity region that is the first charge storage section FD1, it is conceivable to increase the distance L1. From the point of view of suppressing leakage current originating from the first well region 65p in the second impurity region that is the second charge storage section FD2, it is conceivable to increase the distance L2. However, the leakage current in the second impurity region is reflected in the image quality when the first transistor 29 is on and the first and second impurity regions are electrically connected. In this event, since the capacity value of the charge storage node is large, the leakage current is less likely to affect the image quality. When the first transistor 29 is on, charges are stored in the first impurity region to the extent that shot noise becomes apparent, and noise caused by the leakage current of the second impurity region may be hidden by the shot noise. For these reasons, the leakage current originating from the first well region 65p in the second impurity region is less likely to affect the image quality compared to the leakage current originating from the second well region 65n in the first impurity region. With the above taken into account, this configuration is reasonable from the point of view of realizing a compact, high-resolution imaging device 100.

In this embodiment, the distance L4 is greater than the distance L5. This configuration is also reasonable from the point of view of realizing a compact, high-resolution imaging device 100. By securing a distance from the STI structure in plan view, the leakage current resulting from a defective layer of the STI structure can be suppressed.

In this embodiment, the distance L1 is greater than the distance L3. This configuration is advantageous from the point of view of realizing the high-resolution imaging device 100. To be more specific, this configuration makes it easier to increase the distance L1. Therefore, it is easy to suppress the leakage current originating from the second well region 65n in the first impurity region which is the first charge storage section FD1. To be more specific, it is easy to prevent impurities from the second well region 65n from diffusing into the first impurity region, and to prevent parasitic carriers generated in elements such as transistors in the second well region 65n from flowing into the first impurity region.

The distance L4 may be greater than the distance L6. This configuration is also advantageous from the point of view of realizing the high-resolution imaging device 100.

Figure 9:
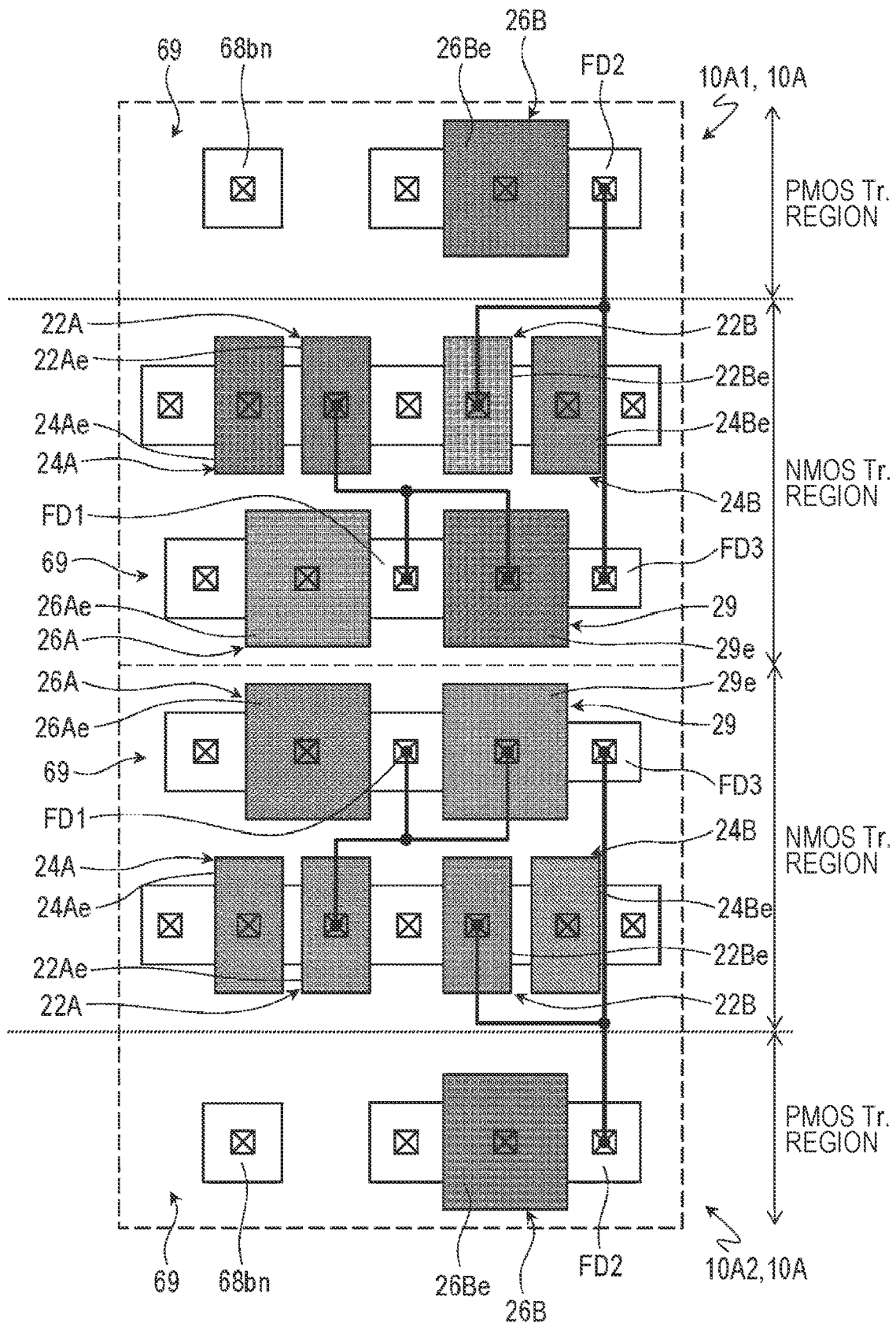
FIG. 9 is a schematic plan view illustrating an example layout of elements in two pixels adjacent to each other.

FIG. 9 is a schematic plan view illustrating an example layout of elements in two pixels 10A adjacent to each other. One of the two pixels 10A is the first pixel 10A1 and the other is the second pixel 10A2.

In the example of FIG. 9, the first and second pixels 10A1 and 10A2 each include the first well region 65p, the second well region 65n, the first transistor 29, the second impurity region that is the second charge storage section FD2, the first contact plug that is the contact plug cpn, the first contact hole h1, the third contact plug that is the contact plug cpn, the third contact hole h3, and the first amplification transistor 22A. In plan view, the second well region 65n of the first pixel 10A1, the first well region 65p of the first pixel the first well region 65p of the second pixel 10A2, and the second well region 65n of the second pixel 10A2 are arranged in this order in a direction from the first pixel 10A1 to the second pixel 10A2. This configuration is advantageous from the point of view of realizing the high-resolution imaging device 100. To be more specific, this configuration makes it easy to secure the distance between the first impurity region, which is the first charge storage section FD1 of the first pixel 10A1, and the second well region 65n of the second pixel 10A2. Therefore, this configuration is advantageous from the point of view of suppressing the leakage current originating from the second well region 65n of the second pixel 10A2 in the first impurity region of the first pixel 10A1. This configuration also makes it easy to secure the distance between the first impurity region of the second pixel 10A2 and the second well region 65n of the first pixel 10A1. Therefore, this configuration is advantageous from the point of view of suppressing the leakage current originating from the second well region 65n of the first pixel 10A1 in the first impurity region of the second pixel 10A2.

To be more specific, in the example of FIG. 9, the second pixel 10A2 is obtained by flipping the first pixel 10A1. The first pixel 10A1 in FIG. 9 corresponds to the pixel in FIG. 4. The second pixel 10A2 in FIG. 9 corresponds to one obtained by flipping the pixel 10A in FIG. 4.

In this embodiment, the imaging device 100 includes the capacitive element 30. The capacitive element 30 is electrically connected to the second impurity region which is the second charge storage section FD2. This configuration is suitable for realizing the wide dynamic range imaging device 100.

In this embodiment, the capacitive element 30 is an MIM capacitor. This configuration is suitable for realizing the wide dynamic range imaging device 100.

In plan view, the capacitive element 30 may overlap at least one selected from the group consisting of the first contact hole h1 and the second contact hole h2. The capacitive element 30 according to this configuration can suppress light incident on at least one selected from the group consisting of the first impurity region which is the first charge storage section FD1 and the second impurity region which is the second charge storage section FD2. Therefore, this configuration is advantageous from the point of view of realizing the high-resolution imaging device 100.

In the example of FIG. 5, the capacitive element 30 is arranged on the insulating layer 90a. However, the capacitive element 30 can be arranged in at least one layer selected from among the insulating layers 90a to 90d. When the capacitive element 30 contains metal or metal compound, the above effect of suppressing incident light is readily achieved. Such a case corresponds to, for example, the case where the capacitive element is the MIM capacitor.

In a first example, the capacitive element 30 overlaps both the first contact hole h1 and the second contact hole h2 in plan view. According to the first example, light incident on both the first impurity region which is the first charge storage section FD1 and the second impurity region which is the second charge storage section FD2 can be suppressed. However, in plan view, the capacitive element 30 may overlap only one of the first and second contact holes h1 and h2. In a second example, in plan view, the capacitive element overlaps the first contact hole h1 but does not overlap the second contact hole h2. As can be understood from the above description, the leakage current in the first impurity region is more likely to affect the image quality than the leakage current in the second impurity region. According to the second example, when there is a constraint such as a limited space for arranging the capacitive element 30, it is possible to suppress the influence of the leakage current on the image quality while meeting the constraint. Note that it is also possible to adopt a third example in which the capacitive element 30 does not overlap the first contact hole h1 but overlaps the second contact hole h2 in plan view.

In this embodiment, the imaging device 100 includes the first reset transistor 26A. The first reset transistor 26A resets the potential of the first impurity region, which is the first charge storage section FD1, to the reset potential $V_{RES}$ The first transistor 29 is turned on when the potential of the first impurity region reaches the threshold potential $V_{OF}$. The second bias potential $V_{NW}$ is applied to the second well region 65n. When the potential of the first impurity region reaches the potential corresponding to the second bias potential $V_{NW}$, the potential of the first impurity region stops changing.

A difference between the reset potential V RES and the threshold potential $V_{OF}$ may be smaller than a difference between the threshold potential $V_{OF}$ and the second bias potential $V_{NW}$. This configuration is suitable for realizing the wide dynamic range imaging device 100. To be more specific, a low-light region with a focus on high sensitivity is typically not so wide. According to this configuration, by appropriately narrowing the low-light region with a focus on high sensitivity where the first transistor 29 is off, a light-intensity region in which the first transistor 29 is on can be widened. Thus, the saturation level of the imaging device 100 can be increased. Accordingly, the wide dynamic range imaging device 100 can be realized. The difference between the reset potential $V_{RES}$ and the threshold potential $V_{OF}$ may be less than or equal to 30% of the difference between the threshold potential $V_{OF}$ and the second bias potential $V_{NW}$.

The difference between the reset potential V RES and the threshold potential $V_{OF}$ may be greater than 10% of the difference between the threshold potential $V_{OF}$ and the second bias potential V N w. This configuration is suitable for avoiding a situation in which the image quality of the imaging device 100 deteriorates due to noise from the second impurity region which is the second charge storage section FD2. To be more specific, the reverse bias voltage applied to the PN junction between the second impurity region and the second well region 65n is typically higher when the storage of charges in the second charge storage section FD2 is not progressing. Therefore, the leakage current in the second impurity region is larger when the storage of charges in the second impurity region is not progressing. Therefore, it is immediately after the first transistor 29 is turned on that the leakage current in the second impurity region is likely to affect the image quality. However, according to this configuration, when the first transistor 29 is turned on, the charges are stored in the first impurity region, which is the first charge storage section FD1, to the extent that the shot noise becomes apparent, and the shot noise is likely to hide noise caused by the leakage current in the second impurity region that is the second charge storage section FD2. The difference between the reset potential V RES and the threshold potential $V_{OF}$ may be greater than 12% of the difference between the threshold potential $V_{OF}$ and the second bias potential $V_{NW}$.

In one numerical example, the reset potential V RES is 0 V. The threshold potential $V_{OF}$ is 0.5 V. The second bias potential $V_{NW}$ is 3.3 V. The difference between the reset potential $V_{RES}$ and the threshold potential $V_{OF}$ is approximately 18% of the difference between the threshold potential $V_{OF}$ and the second bias potential $V_{NW}$.

Note that the threshold potential $V_{OF}$ can be adjusted through adjustment of the threshold voltage of the first transistor 29, adjustment of the reset potential of the second impurity region that is the second charge storage section FD2, and the like.

In this embodiment, the imaging device 100 includes the photoelectric converter 12. The photoelectric converter 12 has the counter electrode 12c, the pixel electrode 12a, and the photoelectric conversion layer 12b. The photoelectric conversion layer 12b is arranged between the counter electrode 12c and the pixel electrode 12a. The photoelectric conversion layer 12b generates charges. The charges are led from the pixel electrode 12a to the first impurity region which is the first charge storage section FD1. The imaging device 100 includes the pixel 10A. The pixel 10A has the photoelectric converter 12, the first transistor 29, the second impurity region that is the second charge storage section FD2, the first well region 65p, and the second well region 65n. The number of pixel electrodes 12a in the pixel 10A is one. This configuration is suitable for realizing a fine imaging device 100. To be more specific, when one pixel includes a plurality of pixel electrodes, it is difficult to reduce the size of the imaging device while avoiding deterioration of the characteristics of the imaging device. In an imaging device with two cells for each pixel, for example, a relatively large pixel electrode is provided in a high-sensitivity cell, and a relatively small pixel electrode is provided in a high-saturation cell. Thus, the size ratio of the pixel electrodes produces a sensitivity ratio. However, it is not easy to reduce the size of the imaging device 100 while maintaining the size ratio of the pixel electrodes, posing a limitation on size reduction. On the other hand, in this embodiment, the number of pixel electrodes 12a in the pixel 10A is one. This configuration alleviates the difficulty of processing and miniaturizing the pixel electrode 12a, and makes it possible to reduce the size of the imaging device 100 without causing deterioration of the characteristics of the imaging device 100, such as low-light sensitivity.

In this embodiment, the imaging device 100 includes the microlens 13 and the photoelectric converter 12. Light enters the photoelectric converter 12 through the microlens 13. The photoelectric converter 12 generates charges. The imaging device 100 includes the pixel 10A. The pixel 10A has the microlens 13, the photoelectric converter 12, the first transistor 29, the second impurity region that is the second charge storage section FD2, the first well region 65p, and the second well region 65n. The number of convex surfaces of the microlens 13 in the pixel 10A is one. This configuration is suitable for realizing a fine imaging device 100. To be more specific, when one pixel has a plurality of convex surfaces of the microlens, it is difficult to reduce the size of the imaging device 100 while avoiding deterioration of the characteristics of the imaging device. In an imaging device with two cells for each pixel, for example, the convex surface of the microlens is made relatively large in a high-sensitivity cell and the convex surface of the microlens is made relatively small in a high-saturation cell. Thus, the size ratio of the convex surface produces a sensitivity ratio. However, it is not easy to reduce the size of the imaging device while maintaining the size ratio of these convex surfaces, posing a limitation on size reduction. When light obliquely enters the convex surface, the sensitivity decreases. In the imaging device with two cells for each pixel, when the imaging device is reduced in size, it becomes difficult to match the degree of sensitivity deterioration due to oblique incidence in the high-sensitivity cell with the degree of sensitivity deterioration due to oblique incidence in the high-saturation cell. On the other hand, in this embodiment, the number of pixel electrodes 12a in the pixel 10A is one. This configuration alleviates the difficulty of processing and miniaturization of the microlens, and makes it possible to reduce the size of the imaging device 100 without causing deterioration of the characteristics of the imaging device 100, such as the oblique incidence characteristics.

In this embodiment, a method for driving the imaging device 100 includes a first step, a second step, and a third step. The first step is increasing the reverse bias voltage applied to the first PN junction due to the storage of charges generated by photoelectric conversion when the first transistor 29 is off. The second step is turning on the first transistor 29 in response to the storage of charges. The third step is discharging the charges by reducing the reverse bias voltage applied to the second PN junction due to the storage of charges when the first transistor 29 is on, and thus applying the forward bias voltage to the second PN junction. This configuration is suitable for realizing the wide dynamic range imaging device 100 which is less likely to fail even when receiving a large amount of light.

To be more specific, in the first step, when the first transistor 29 is off, charges are generated by photoelectric conversion in the imaging device 100 and stored in a region partitioned by the first transistor 29 in the imaging device 100. This increases the reverse bias voltage applied to the first PN junction. In the second step, the first transistor 29 is turned on when the source-drain voltage of the first transistor 29 reaches the threshold voltage as the charges are stored in the partitioned region. In the third step, when the first transistor 29 is on, the charges are stored in the region across the first transistor 29 in the imaging device 100, thereby reducing the reverse bias voltage applied to the second PN junction. As a result, the forward bias voltage is applied to the second PN junction, thereby discharging the charges.

In the above context, the first PN junction can be a PN junction between the first impurity region, which is the first charge storage section FD1, and the first well region 65p. The second PN junction may be a PN junction between the second impurity region, which is the second charge storage section FD2, and the second well region 65n.

Hereinafter, several other embodiments will be described. In the following description, elements common to the embodiment already described and embodiments subsequently described are denoted by the same reference signs, and descriptions of these may be omitted. The descriptions regarding the respective embodiments may be applied to each other as long as there is no technical discrepancy. The embodiments may be combined with each other as long as there is no technical discrepancy.

Second Embodiment

Figure 10:
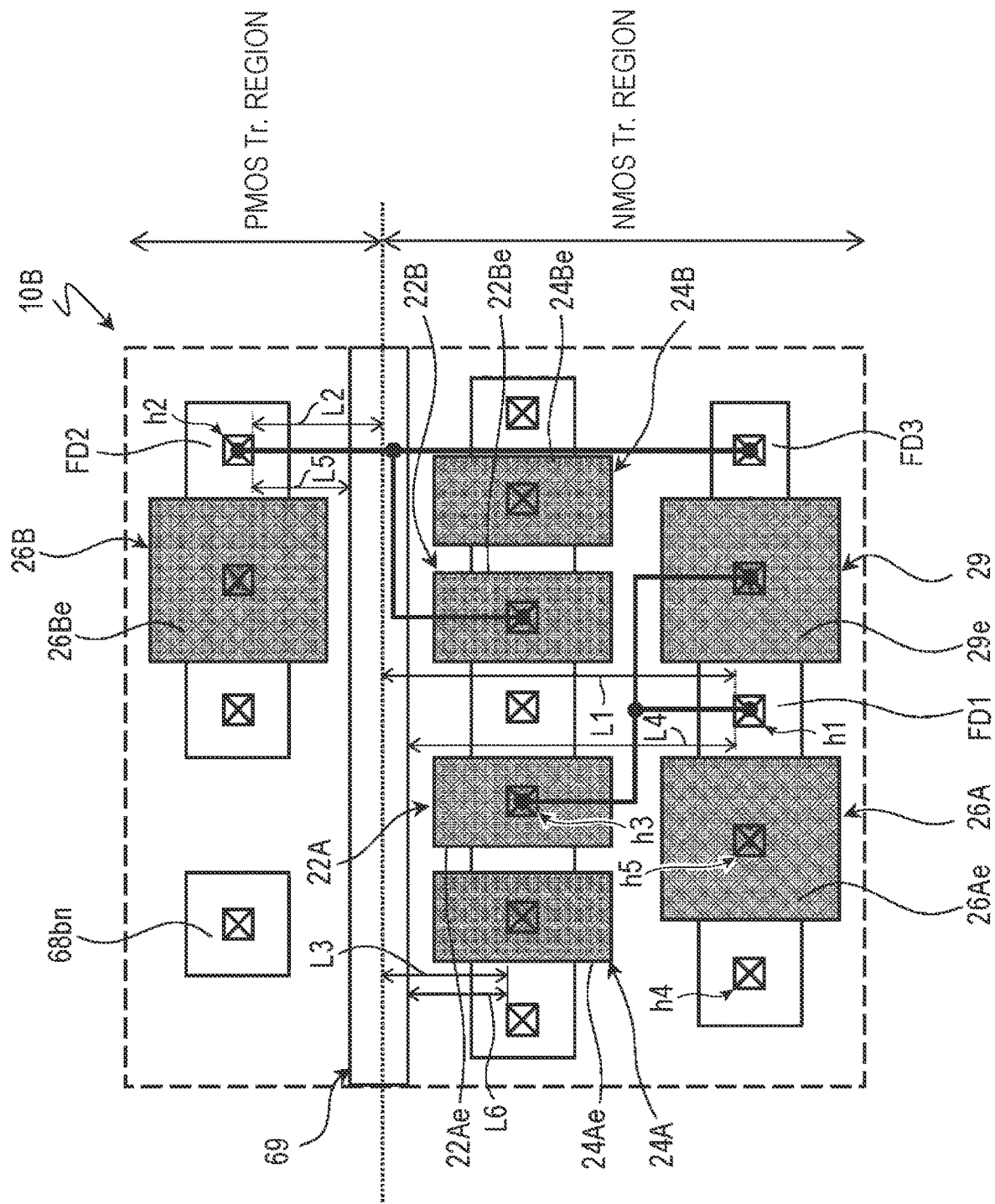
FIG. 10 is a schematic plan view illustrating an example layout of elements in a pixel according to a second embodiment.

FIG. 10 is a schematic plan view illustrating an example layout of elements in a pixel 10B according to a second embodiment. In the second embodiment, in plan view, an element isolation region 69 extends in the form of a strip along a PN junction between a first well region 65p and a second well region 65n. To be more specific, in this embodiment, the element isolation region 69 has an STI structure. In this example, the PN junction can be formed between the element isolation region 69 and a support substrate 61 in a thickness direction of a semiconductor substrate 60. In the example of FIG. 10, when the magnitude relationship of distance L1>distance L2 holds true, the magnitude relationship of distance L4>distance L5 is also likely to hold true. Likewise, when the magnitude relationship of distance L1>distance L3 holds true, the magnitude relationship of distance L4>distance L6 is also likely to hold true.

Figure 11:
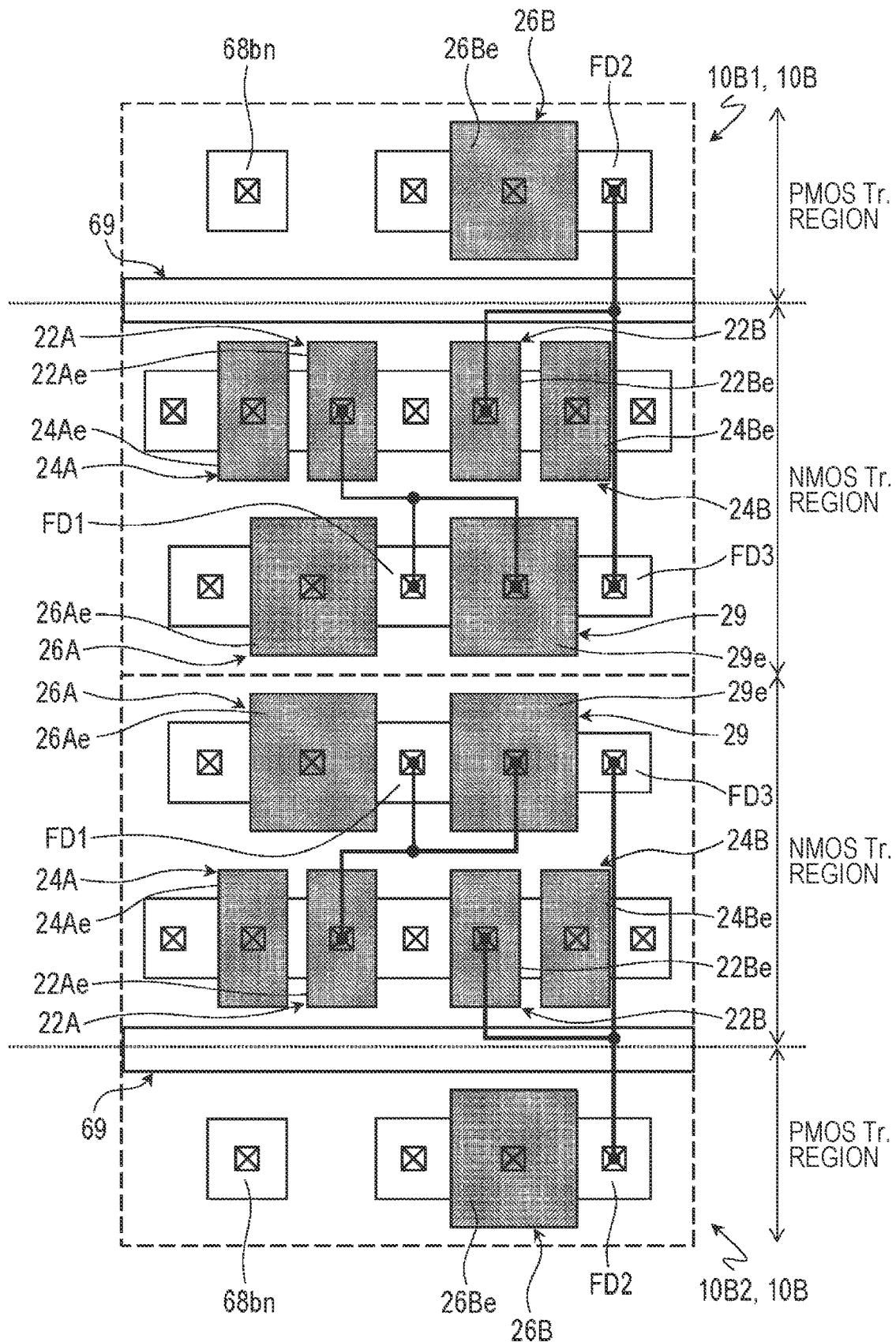
FIG. 11 is a schematic plan view illustrating an example layout of elements in two pixels adjacent to each other.

FIG. 11 is a schematic plan view illustrating an example layout of elements in two pixels 10B adjacent to each other. One of the two pixels 10B is the first pixel 10B1 and the other is the second pixel 10B2.

In the example of FIG. 11, the first and second pixels 10B1 and 10B2 each include a first well region 65p, a second well region 65n, a first transistor 29, a second impurity region that is a second charge storage section FD2, a first contact plug that is a contact plug cpn, a first contact hole h1, a third contact plug that is a contact plug cpn, a third contact hole h3, and a first amplification transistor 22A. In plan view, the second well region 65n of the first pixel 10B1, the first well region 65p of the first pixel 10B1, the first well region of the second pixel 10B2, and the second well region 65n of the second pixel 10B2 are arranged in this order in a direction from the first pixel 10B1 to the second pixel 10B2.

To be more specific, in the example of FIG. 11, the second pixel 10B2 is obtained by flipping the first pixel 10B1. The first pixel 10B1 in FIG. 11 corresponds to the pixel in FIG. 10. The second pixel 10B2 in FIG. 10 corresponds to one obtained by flipping the pixel 10B in FIG. 10.

Third Embodiment

Figure 12:
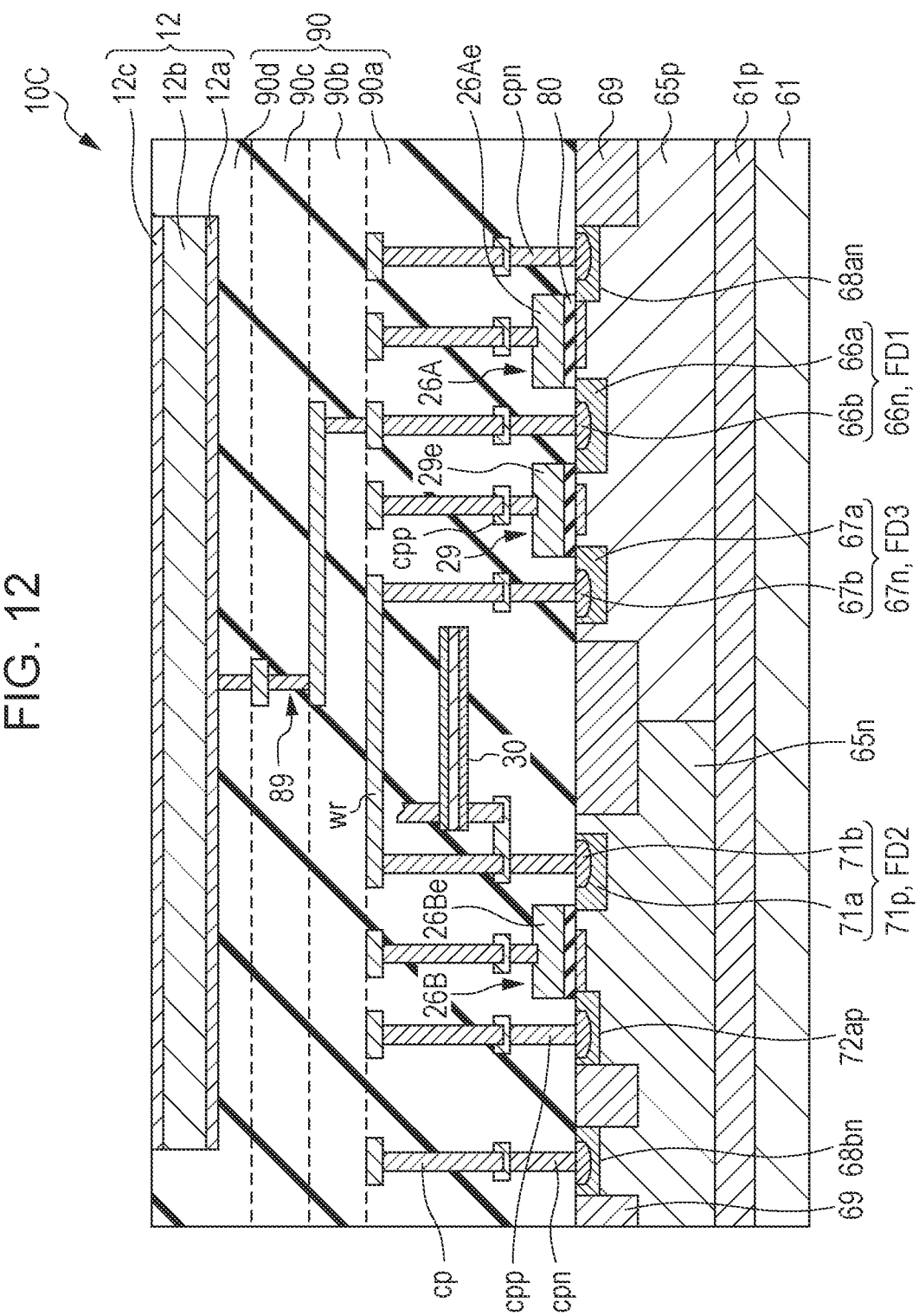
FIG. 12 is a sectional view schematically illustrating a configuration of a pixel according to a third embodiment.

FIG. 12 is a sectional view schematically illustrating a configuration of a pixel 10C according to a third embodiment. In the third embodiment, a gate electrode 29e of a first transistor 29, which is a protection transistor, is a gate electrode doped with P-type impurities. According to this configuration, even when a channel dose of the first transistor 29 is suppressed, a threshold voltage of the first transistor 29 can be ensured by contribution of a work function of the gate electrode 29e. By suppressing the channel dose, it is possible to reduce a PN junction electric field intensity around a first charge storage section FD1 and a third charge storage section FD3, which are formed in a first well region 65p. Thus, leakage current can be suppressed. In the third embodiment, a contact plug cpp is connected to the gate electrode 29e of the first transistor 29. To be more specific, the contact plug cpp is connected to the gate electrode 29e through a contact hole.

This embodiment will be further described below using the term "first transistor 29". The first transistor 29 corresponds to a protection transistor.

In this embodiment, the gate electrode 29e of the first transistor 29 has a conductivity type opposite to that of the source and drain of the first transistor 29. This configuration makes it easier to suppress the leakage current.

Fourth Embodiment

Figure 13:
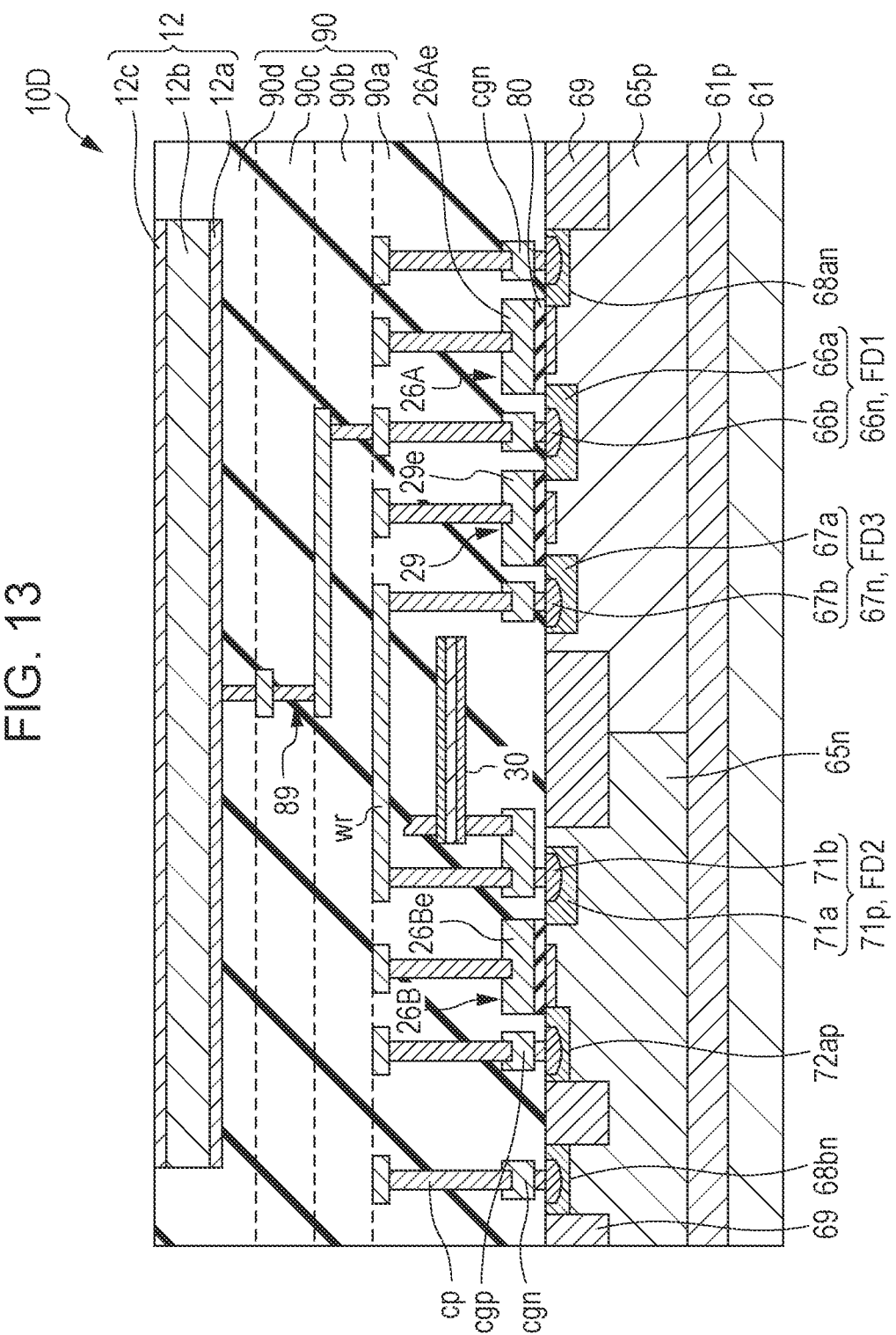
FIG. 13 is a sectional view schematically illustrating a configuration of a pixel according to a fourth embodiment.

FIG. 13 is a sectional view schematically illustrating a configuration of a pixel 10D according to a fourth embodiment. In the fourth embodiment, an imaging device 100 has contact plugs cgn and cgp, instead of the contact plugs cpn and cpp. The contact plugs cgn and cgp are the same as the gate electrodes 22Ae, 24Ae, 26Ae, 29e, 22Be, 24Be, and 26Be in having a film-shaped portion. The contact plugs cgn and cgp are also the same as the gate electrodes 22Ae, 24Ae, 26Ae, 29e, 22Be, 24Be, and 26Be in being made of polysilicon. These commonalities mean that the contact plugs cgn and cgp and the gate electrodes 22Ae, 24Ae, 26Ae, 29e, 22Be, 24Be, and 26Be can be formed by a common film formation process. This is advantageous from the point of view of simplifying the manufacturing process. The contact plugs cgn and cgp in the fourth embodiment can also be referred to as gate polysilicon pads.

In the fourth embodiment, the contact plugs cgn and cgp have the same height as that of the gate electrodes 22Ae, 24Ae, 26Ae, 29e, 22Be, 24Be, and 26Be. A plug cp is connected to each of these elements having the same height. This is also advantageous from the point of view of simplifying the manufacturing process.

Fifth Embodiment

Figure 14:
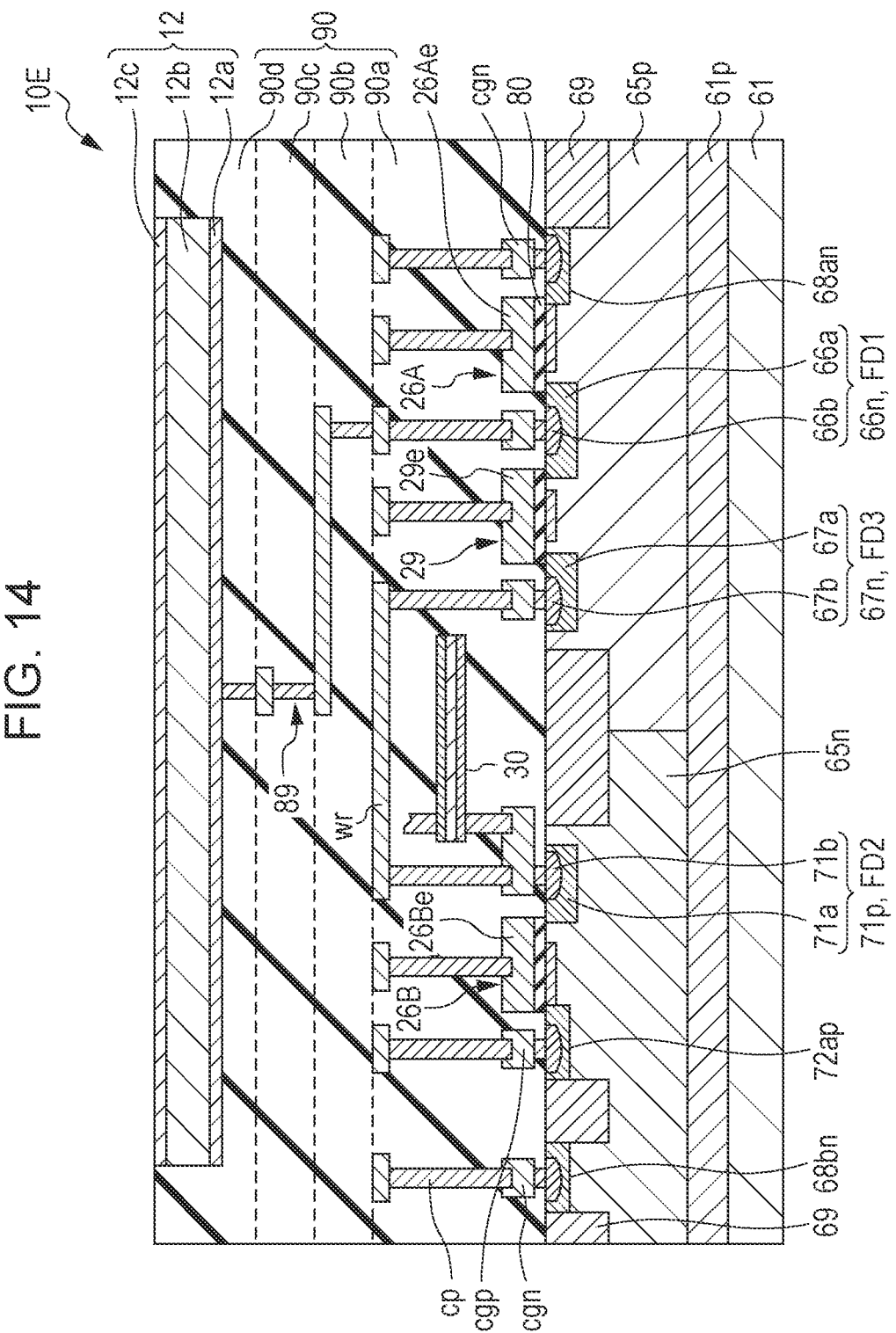
FIG. 14 is a sectional view schematically illustrating a configuration of a pixel according to a fifth embodiment.

FIG. 14 is a sectional view schematically illustrating a configuration of a pixel 10E according to a fifth embodiment. An imaging device 100 according to the fifth embodiment includes the gate electrode 29e doped with the P-type impurities described in the third embodiment, and the contact plugs cgn and cgp described in the fourth embodiment.

Sixth Embodiment

Figure 15:
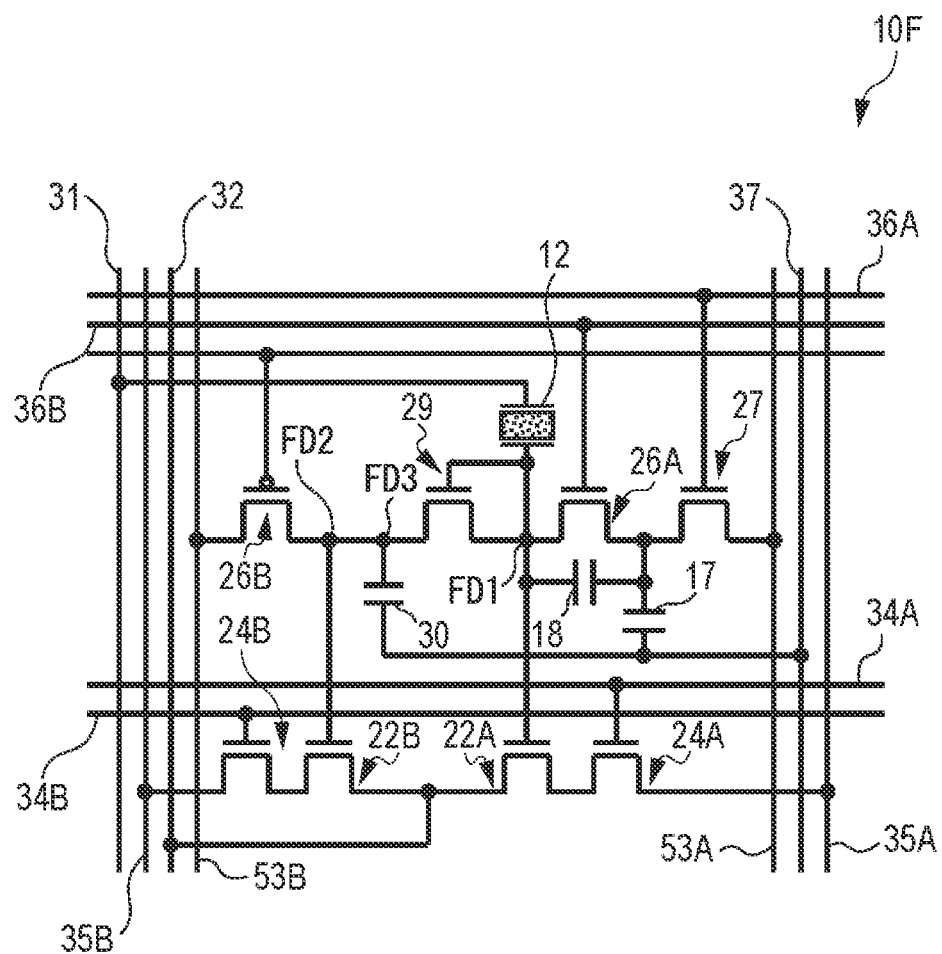
FIG. 15 is a schematic diagram illustrating an exemplary circuit configuration of a pixel in an imaging device according to a sixth embodiment.

FIG. 15 is a schematic diagram illustrating an exemplary circuit configuration of a pixel 10F in an imaging device according to a sixth embodiment. In the sixth embodiment, the pixel 10F includes a feedback transistor 27. In the sixth embodiment, a column feedback circuit is configured using the feedback transistor 27. The pixel 10F also includes a capacitive element 17 and a capacitive element 18.

In this embodiment, the feedback transistor 27 is an N-type transistor. To be more specific, the feedback transistor 27 is an NMOS. The capacitive elements 17 and 18 are, for example, MIM capacitors.

The capacitive element 18 has one end electrically connected to a first charge storage section FD1. The capacitive element 18 has the other end electrically connected to one of the source and drain of the feedback transistor 27 and one end of the capacitive element 17. The capacitive element 17 has the other end electrically connected to a capacitive terminal line 37. The other of the source and drain of the feedback transistor 27 is electrically connected to a first feedback line 53A.

The first charge storage section FD1, a first amplification transistor 22A, a first address transistor 24A, a first output line 35A, a first inverting amplifier 50A, the first feedback line 53A, the feedback transistor 27, the capacitive element 18, and the first charge storage section FD1 are connected in this order. This connection allows negative feedback of a signal derived from the potential of the first charge storage section FD1 to the first charge storage section FD1.

One of the source and drain of a second reset transistor 26B is a second charge storage section FD2. The other of the source and drain of the second reset transistor 26B is electrically connected to a second feedback line 53B.

The second charge storage section FD2, a second amplification transistor 22B, a second address transistor 24B, a second output line 35B, a second inverting amplifier 50B, the second feedback line 53B, the other of the source and drain of the second reset transistor 26B, and the second charge storage sections FD2 are connected in this order. This connection allows negative feedback of a signal derived from the potential of the second charge storage section FD2 to the second charge storage section FD2.

Seventh Embodiment

Figure 16:
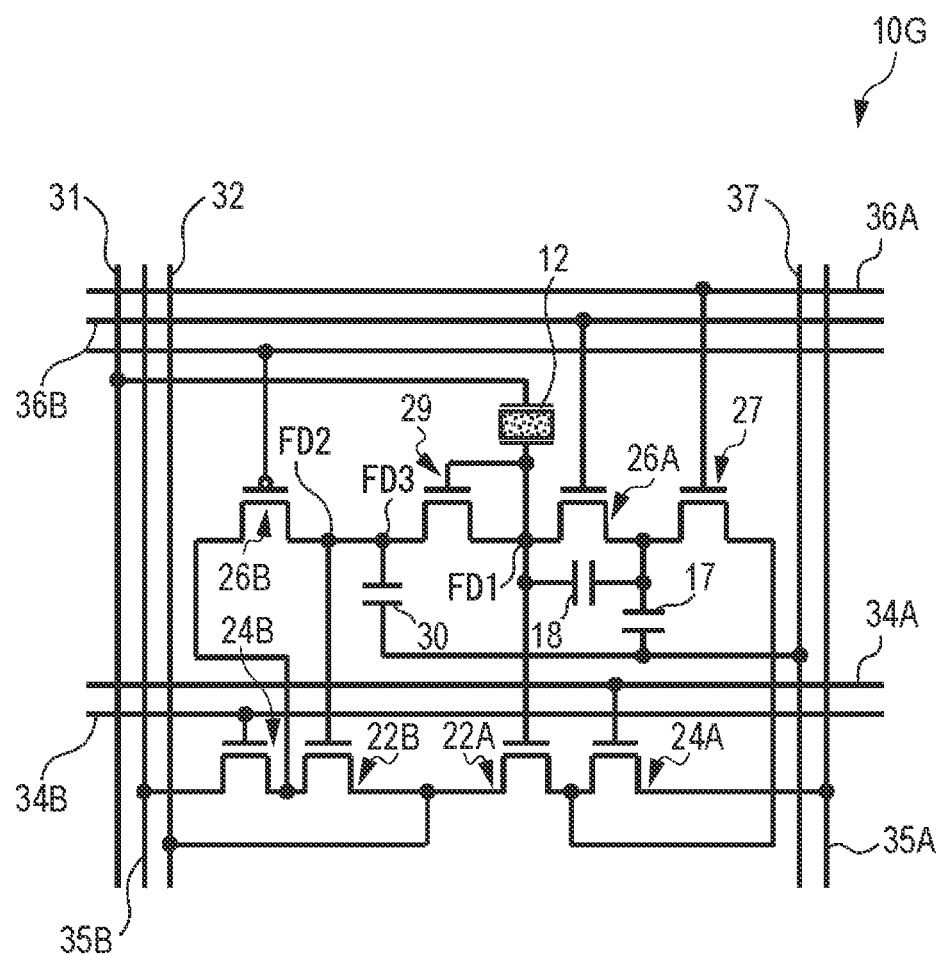
FIG. 16 is a schematic diagram illustrating an exemplary circuit configuration of a pixel in an imaging device according to a seventh embodiment.

FIG. 16 is a schematic diagram illustrating an exemplary circuit configuration of a pixel 10G in an imaging device according to a seventh embodiment. In the seventh embodiment, an intra-pixel feedback circuit is configured instead of a column feedback circuit using inverting amplifiers 50A and 50B.

A capacitive element 18 has one end electrically connected to the first charge storage section FD1. The capacitive element 18 has the other end electrically connected to one of the source and drain of a feedback transistor 27 and one end of a capacitive element 17. The other end of the capacitive element 17 is electrically connected to a capacitive terminal line 37. One of the source and drain of a first amplification transistor 22A is electrically connected to a power supply wiring line 32. The other of the source and drain of the first amplification transistor 22A and one of the source and drain of a first address transistor 24A are electrically connected to the other of the source and drain of the feedback transistor 27.

The first charge storage section FD1, the first amplification transistor 22A, the feedback transistor 27, the capacitive element 18, and the first charge storage section FD1 are connected in this order. This connection allows negative feedback of a signal derived from the potential of the first charge storage section FD1 to the first charge storage section FD1.

One of the source and drain of a second reset transistor 26B is a second charge storage section FD2. One of the source and drain of a second amplification transistor 22B is electrically connected to the power supply wiring line 32. The other of the source and drain of the second amplification transistor 22B and one of the source and drain of a second address transistor 24B are electrically connected to the other of the source and drain of the second reset transistor 26B.

The second charge storage section FD2, the second amplification transistor 22B, the other of the source and drain of the second reset transistor 26B, and the second charge storage section FD2 are connected in this order. This connection allows negative feedback of a signal derived from the potential of the second charge storage section FD2 to the second charge storage section FD2.

Eighth Embodiment

Figure 17:
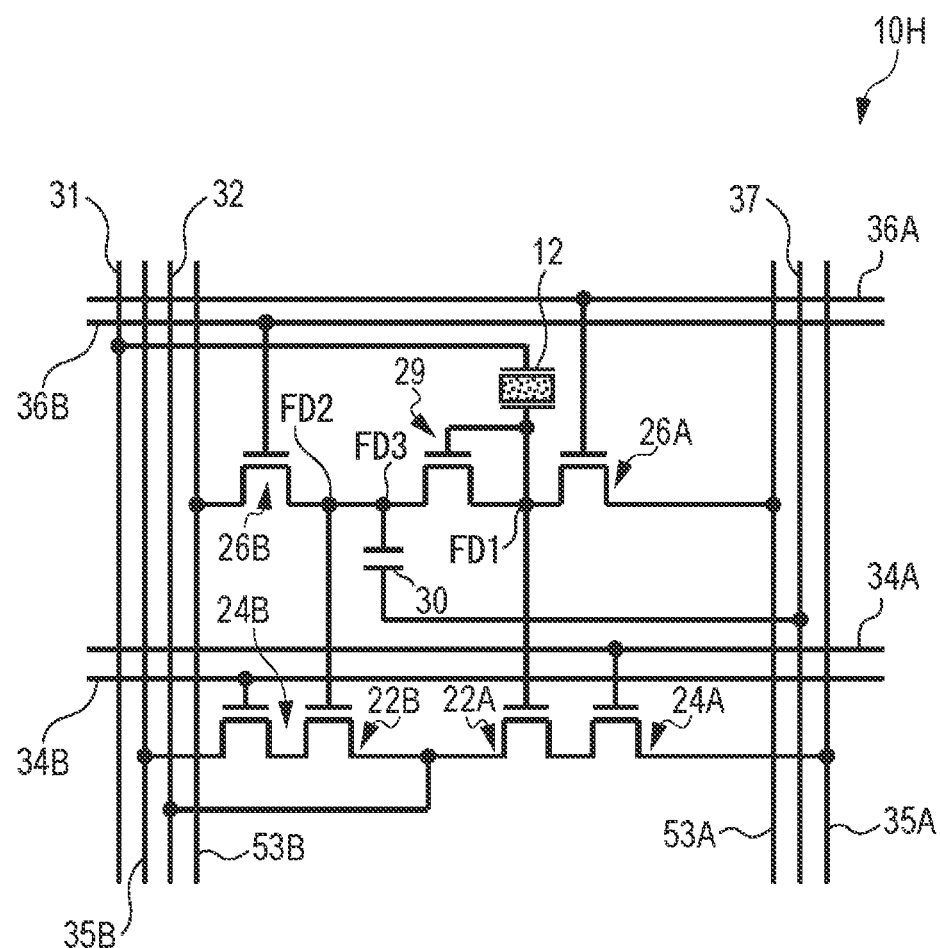
FIG. 17 is a schematic diagram illustrating an exemplary circuit configuration of a pixel in an imaging device according to an eighth embodiment.
Figure 18:
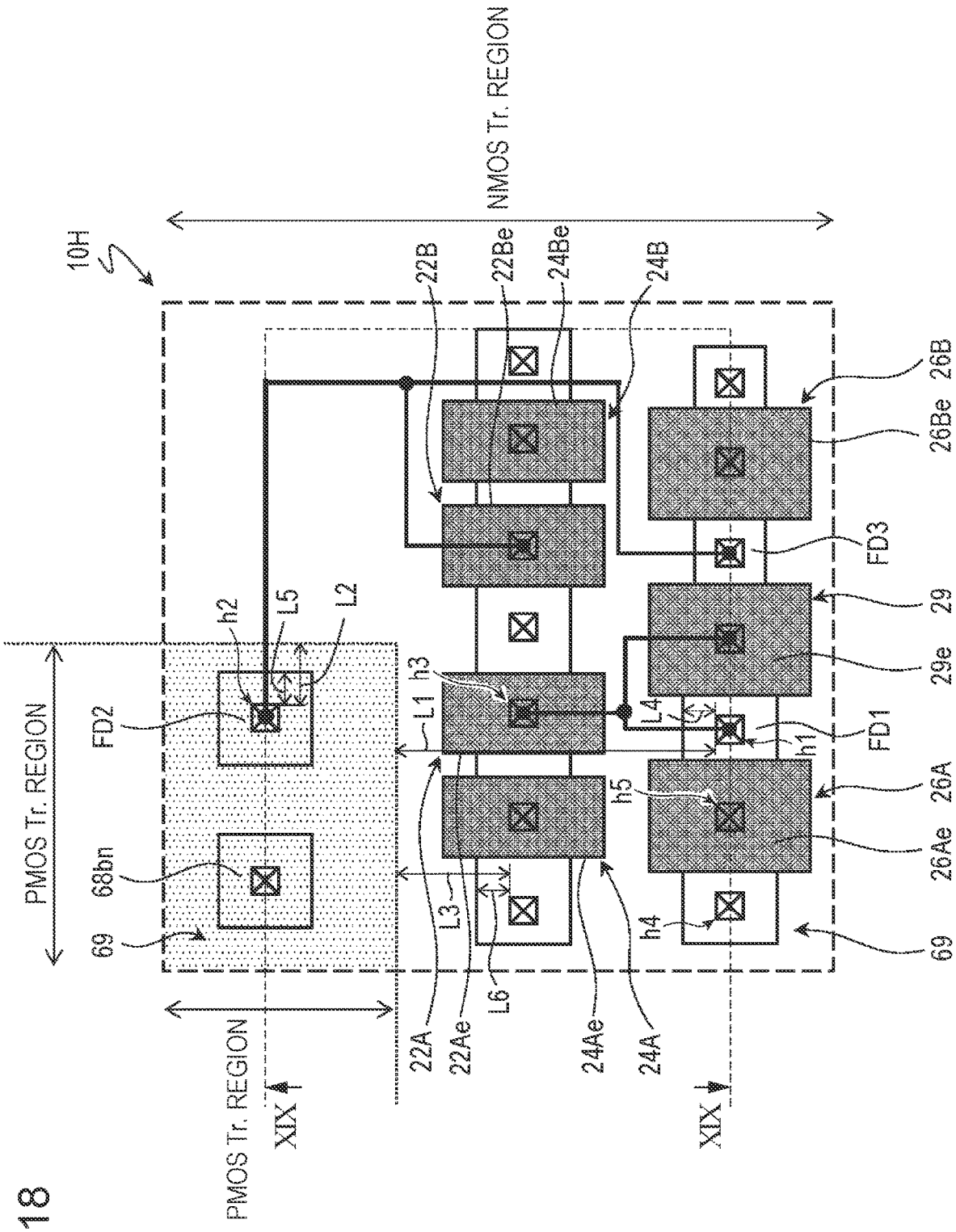
FIG. 18 is a schematic plan view illustrating an example layout of elements in a pixel according to the eighth embodiment.
Figure 19:
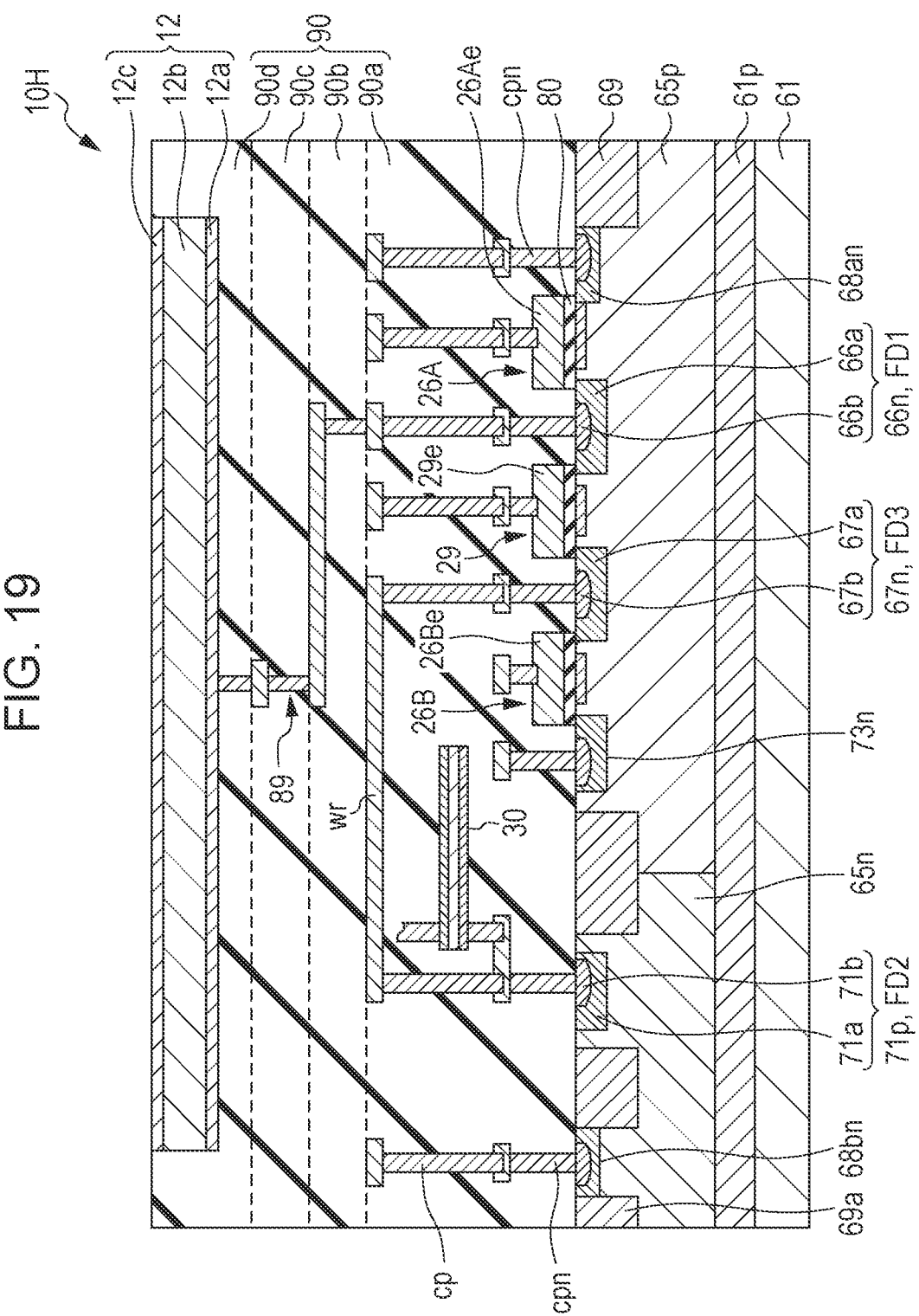
FIG. 19 is a sectional view taken along line XIX-XIX, schematically illustrating a configuration of the pixel according to the eighth embodiment.

FIG. 17 is a schematic diagram illustrating an exemplary circuit configuration of a pixel 10H in an imaging device 100 according to an eighth embodiment. FIG. 18 is a schematic plan view illustrating an example layout of elements in the pixel 10H according to the eighth embodiment. FIG. 19 is a sectional view schematically illustrating arrangement of the elements in the pixel 10H illustrated in FIG. 18. The cross-section illustrated in FIG. 19 is obtained by cutting and expanding the pixel 10H along the broken line XIX-XIX in FIG. 18.

The eighth embodiment is different from the first embodiment in that a second reset transistor 26B is an N-type transistor. To be more specific, the second reset transistor 26B in the eighth embodiment is an NMOS. The second reset transistor 26B is provided in a first well region 65p.

In the eighth embodiment, a first charge storage section FD1 is one of the source and drain of a first transistor 29 that is a protection transistor. The first charge storage section FD1 is also one of the source and drain of a first reset transistor 26A. A third charge storage section FD3 is the other of the source and drain of the first transistor 29. The third charge storage section FD3 is also one of the source and drain of the second reset transistor 26B. A second charge storage section FD2 is different from the source and drain of the second reset transistor 26B. The second charge storage section FD2 is an impurity region 71p. Note that, in FIG. 19, an impurity region 73n is the other of the source and drain of the second reset transistor 26B. The impurity region 73n is an N-type impurity region.

According to the eighth embodiment, a second well region 65n in the pixel 10H can be reduced in size. This is advantageous from the point of view of reducing the size of the pixel 10H. According to the eighth embodiment, all transistors in the pixel 10H can be NMOSs. This is advantageous from the point of view of simplifying the manufacturing process of the imaging device.

Ninth Embodiment

Figure 20:
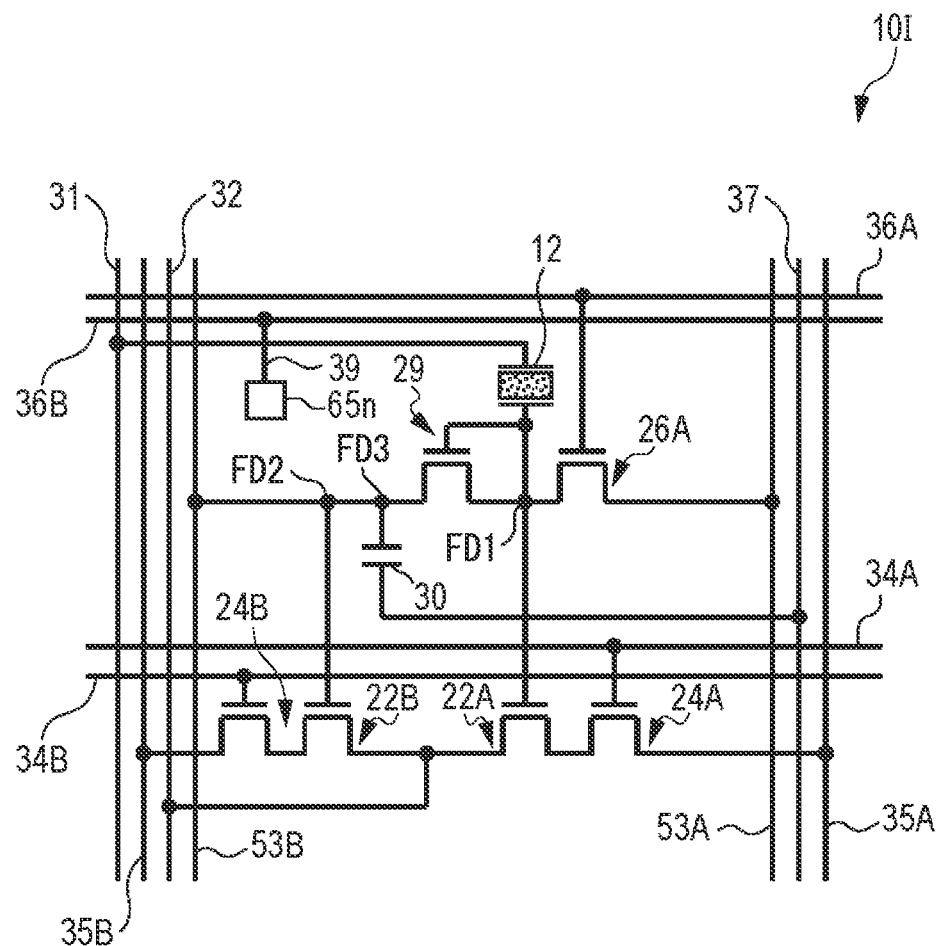
FIG. 20 is a schematic diagram illustrating an exemplary circuit configuration of a pixel in an imaging device according to a ninth embodiment.
Figure 21:
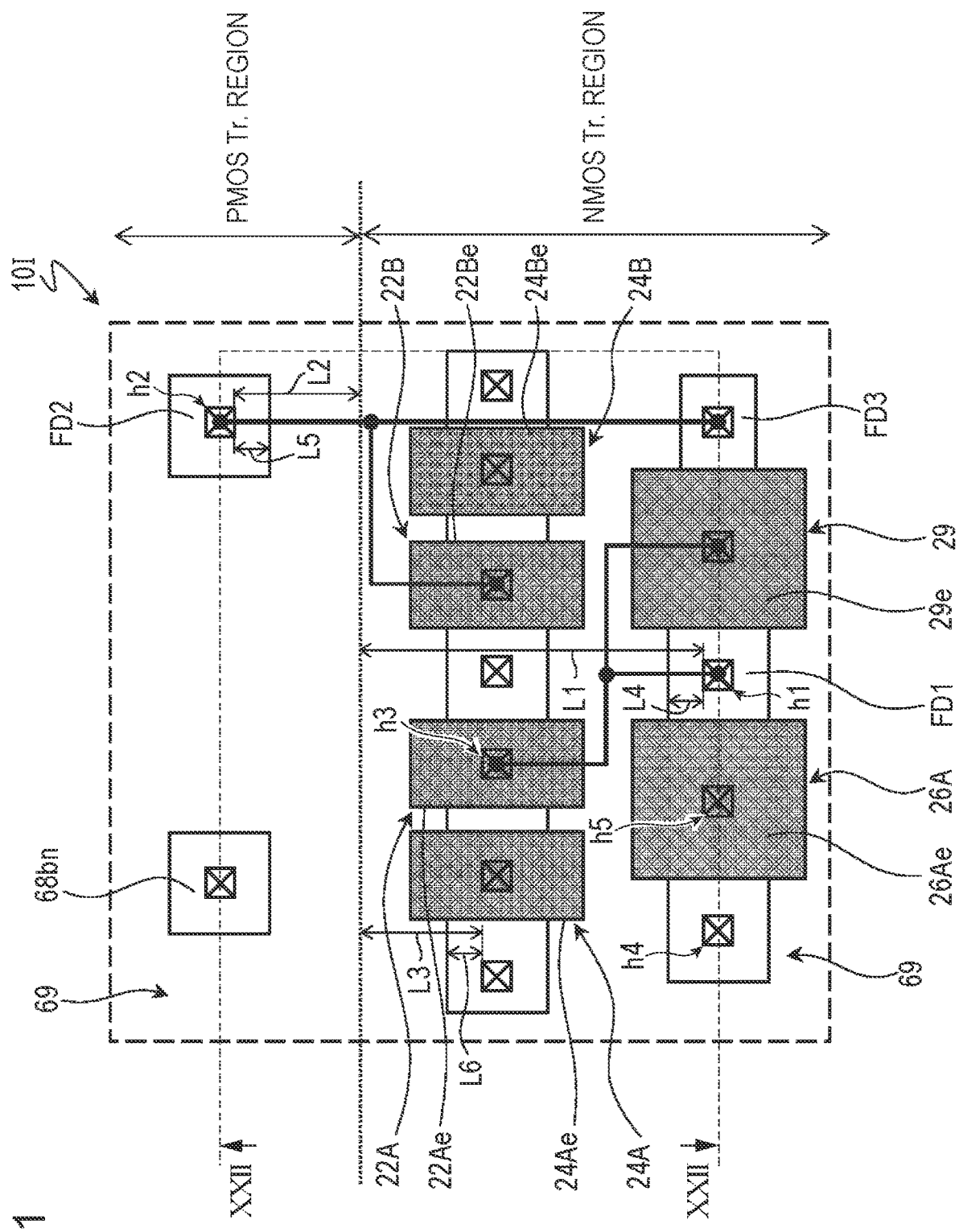
FIG. 21 is a schematic plan view illustrating an example layout of elements in a pixel according to the ninth embodiment.
Figure 22:
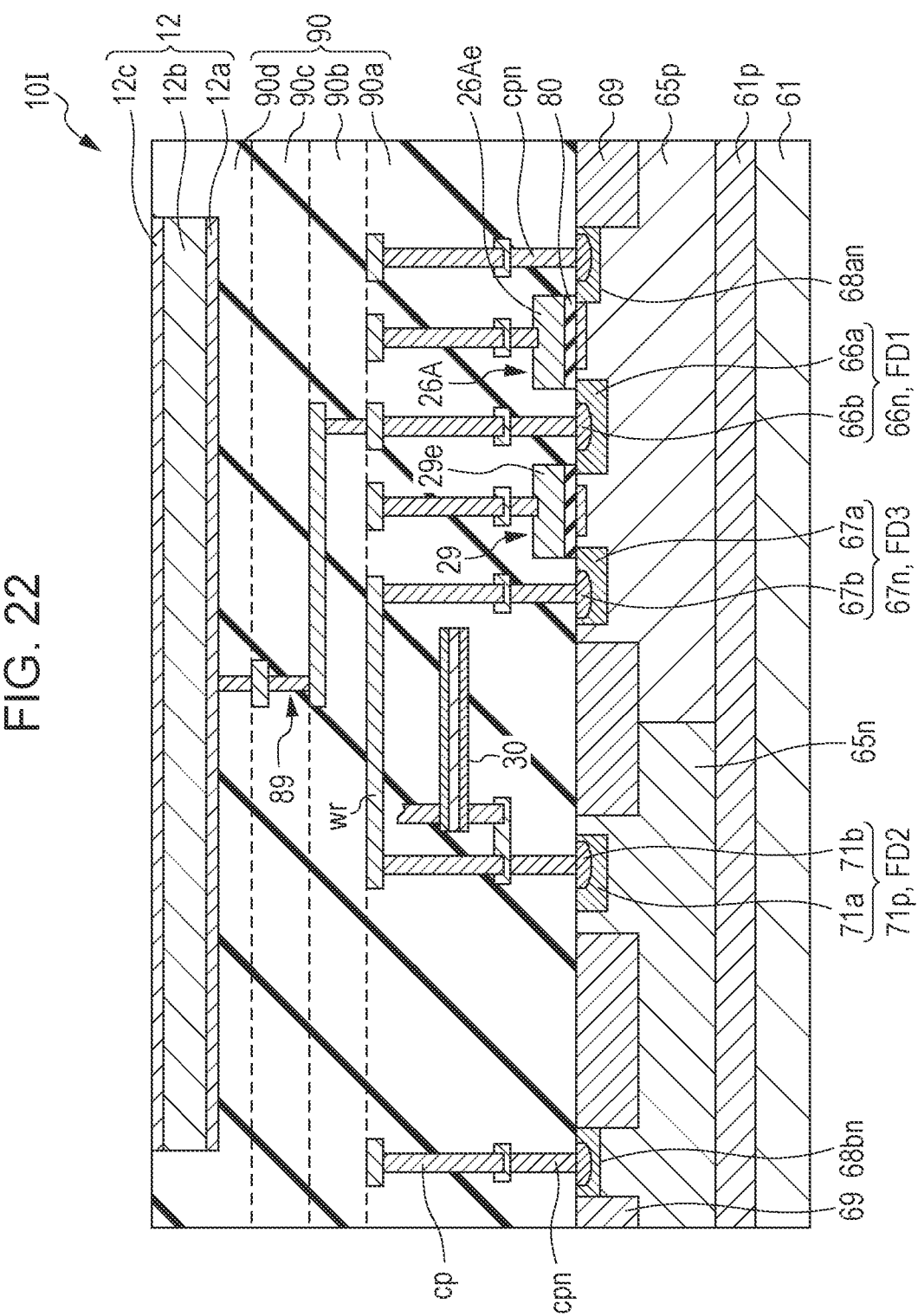
FIG. 22 is a sectional view taken along line XXII-XXII, schematically illustrating a configuration of the pixel according to the ninth embodiment.

FIG. 20 is a schematic diagram illustrating an exemplary circuit configuration of a pixel 10I in an imaging device 100 according to a ninth embodiment. FIG. 21 is a schematic plan view illustrating an example layout of elements in the pixel 10I according to the ninth embodiment. FIG. 22 is a sectional view schematically illustrating an arrangement of the elements in the pixel 10I illustrated in FIG. 21. The cross-section illustrated in FIG. 22 is obtained by cutting and expanding the pixel 10I along the broken line XXII-XXII in FIG. 21.

The ninth embodiment is different from the first embodiment in that the second reset transistor 26B is not provided. In the ninth embodiment, a second charge storage section FD2 is an impurity region 71p.

In the ninth embodiment, the imaging device includes a well-reset line 39. A potential is applied to a second well region 65n through the well-reset line 39. This application can reset the potential of the second charge storage section FD2. In one specific example, the well-reset line 39 applies a potential to the second well region 65n through a plug cp, a contact plug cpn, and an impurity region 68bn in this order.

According to the ninth embodiment, the second well region 65n in the pixel 10I can be reduced in size. This is advantageous from the point of view of reducing the size of the pixel 10I. The absence of the second reset transistor 26B is also advantageous from the point of view of reducing the size of the pixel 10I. According to the ninth embodiment, all transistors in the pixel 10I can be NMOSs. This is advantageous from the point of view of simplifying the manufacturing process of the imaging device.

Various modifications can be applied to the technology according to the above-described embodiments. For example, in the example of FIG. 5, the plug cp and the gate electrode 26Be are connected via the contact plug cpp. The plug cp and the gate electrode 29e are connected via the contact plug cpn. However, the plug cp and the gate electrode 26Be may be directly connected. The plug cp and the gate electrode 29e may be directly connected. In the example of FIG. 12, the plug cp and the gate electrode 29e are connected via the contact plug cpp. However, the plug cp and the gate electrode 29e may be directly connected.

Likewise, the connection between the plug cp and the other gate electrodes may be made indirectly via the contact plugs cpn or cpp, or may be made directly.

The imaging device according to the present disclosure is useful for image sensors, digital cameras, and the like, for example. The imaging device according to the present disclosure can be used for medical cameras, robot cameras, security cameras, cameras mounted on vehicles, and the like.

What is claimed is:

1. An imaging device comprising:
   a semiconductor substrate; and
   a first transistor provided on the semiconductor substrate and including a first gate electrode, a source, and a drain, wherein
   the semiconductor substrate includes
      a first well region of a second conductivity type,
      a second well region of a first conductivity type different from the second conductivity type,
      a first impurity region of the first conductivity type, the first impurity region being positioned in the first well region, being one of the source and the drain, holding charges generated by photoelectric conversion, and being electrically connected to the first gate electrode, and
      a second impurity region of the second conductivity type, the second impurity region being positioned in the second well region and electrically connected to the other of the source and the drain.

2. The imaging device according to claim 1, wherein
   a first bias potential is applied to the first well region, and
   a second bias potential different from the first bias potential is applied to the second well region.

3. The imaging device according to claim 2, wherein
   a potential of the second impurity region changes in accordance with generation of the charges, and
   a change in the potential of the second impurity region due to the generation of the charges stops at a potential corresponding to the second bias potential.

4. The imaging device according to claim 1, further comprising:
   a first contact plug;
   a first contact hole;
   a second contact plug; and
   a second contact hole, wherein
   the first contact plug is connected to the first impurity region through the first contact hole,
   the second contact plug is connected to the second impurity region through the second contact hole, and
   in plan view, a distance between the second well region and the first contact hole is greater than a distance between the first well region and the second contact hole.

5. The imaging device according to claim 1, further comprising:
   a first contact plug;
   a first contact hole;
   a second contact plug; and
   a second contact hole, wherein
   the semiconductor substrate further includes a shallow trench isolation structure,
   the first contact plug is connected to the first impurity region through the first contact hole,
   the second contact plug is connected to the second impurity region through the second contact hole, and
   in plan view, a distance between the shallow trench isolation structure and the first contact hole is greater than a distance between the shallow trench isolation structure and the second contact hole.

6. The imaging device according to claim 1, further comprising:
   a first contact plug;
   a first contact hole;
   a third contact plug;
   a third contact hole; and
   an amplification transistor provided on the semiconductor substrate and including a second gate electrode, wherein
   the amplification transistor outputs an electric signal corresponding to a potential of the first impurity region,
   the first contact plug is connected to the first impurity region through the first contact hole,
   the third contact plug is connected to the second gate electrode through the third contact hole, and
   in plan view, a distance between the second well region and the first contact hole is greater than a distance between the second well region and the third contact hole.

7. The imaging device according to claim 1, further comprising:
   a first contact plug;
   a first contact hole;
   a third contact plug;
   a third contact hole; and
   an amplification transistor provided on the semiconductor substrate and including a second gate electrode, wherein
   the semiconductor substrate further includes a shallow trench isolation structure, the amplification transistor outputs an electric signal corresponding to a potential of the first impurity region,
   the first contact plug is connected to the first impurity region through the first contact hole,
   the third contact plug is connected to the second gate electrode through the third contact hole, and
   in plan view, a distance between the shallow trench isolation structure and the first contact hole is greater than a distance between the shallow trench isolation structure and the third contact hole.

8. The imaging device according to claim 1, further comprising:
   a capacitive element electrically connected to the second impurity region.

9. The imaging device according to claim 8, wherein
   the capacitive element is a metal-insulator-metal capacitor.

10. The imaging device according to claim 1, further comprising:
    a first contact plug;
    a first contact hole;
    a second contact plug;
    a second contact hole; and
    a capacitive element electrically connected to the second impurity region, wherein the first contact plug is connected to the first impurity region through the first contact hole,
    the second contact plug is connected to the second impurity region through the second contact hole, and
    in plan view, the capacitive element overlaps at least one selected from the group consisting of the first contact hole and the second contact hole.

11. The imaging device according to claim 1, further comprising:
a reset transistor that resets a potential of the first impurity region to a reset potential, wherein
the first transistor is turned on when the potential of the first impurity region reaches a threshold potential,
a second bias potential is applied to the second well region,
the potential of the first impurity region stops changing when the potential of the first impurity region reaches a potential corresponding to the second bias potential, and
a difference between the reset potential and the threshold potential is smaller than a difference between the threshold potential and the second bias potential.

12. The imaging device according to claim 1, further comprising:
a reset transistor that resets a potential of the first impurity region to a reset potential, wherein
the first transistor is turned on when the potential of the first impurity region reaches a threshold potential,
a second bias potential is applied to the second well region,
the potential of the first impurity region stops changing when the potential of the first impurity region reaches a potential corresponding to the second bias potential, and
a difference between the reset potential and the threshold potential is greater than 10% of a difference between the threshold potential and the second bias potential.

13. The imaging device according to claim 1, further comprising:
a photoelectric converter including a counter electrode, a pixel electrode, and a photoelectric conversion layer that is disposed between the counter electrode and the pixel electrode and that generates the charges, wherein
the charges are guided from the pixel electrode to the first impurity region,
a portion including the photoelectric converter, the first transistor, the second impurity region, the first well region, and the second well region is defined as a first pixel in the imaging device, and
the first pixel has a single-pixel electrode.

14. The imaging device according to claim 1, further comprising:
a microlens; and
a photoelectric converter, wherein
light enters the photoelectric converter through the microlens,
the photoelectric converter generates the charges,
a portion including the microlens, the photoelectric converter, the first transistor, the second impurity region, the first well region, and the second well region is defined as a first pixel in the imaging device, and
the microlens in the first pixel has a single convex surface.

15. An imaging device comprising:
a first pixel provided on a semiconductor substrate; and
a second pixel provided on the semiconductor substrate and adjacent to the first pixel, wherein
each of the first pixel and the second pixel includes
a first transistor provided on the semiconductor substrate and including a first gate electrode, a source, and a drain,
an amplification transistor provided on the semiconductor substrate and including a second gate electrode,
a first well region of a second conductivity type, the first well region being positioned in the semiconductor substrate,
a second well region of a first conductivity type different from the second conductivity type, the second well region being positioned in the semiconductor substrate,
a first impurity region of the first conductivity type, the first impurity region being positioned in the first well region, being one of the source and the drain, holding charges generated by photoelectric conversion, and being electrically connected to the first gate electrode,
a second impurity region of the second conductivity type, the second impurity region being positioned in the second well region and electrically connected to the other of the source and the drain,
a first contact hole,
a first contact plug connected to the first impurity region through the first contact hole,
a third contact hole, and
a third contact plug connected to the second gate electrode through the third contact hole, and
the second well region of the first pixel, the first well region of the first pixel, the first well region of the second pixel, and the second well region of the second pixel are arranged in this order in a direction from the first pixel toward the second pixel in plan view.

16. A method for driving an imaging device including a first transistor, a first PN junction, a second PN junction, and a third PN junction, the method comprising:
increasing a reverse bias voltage applied to the first PN junction by storing charges generated by photoelectric conversion when the first transistor is off;
turning on the first transistor by storing the charges; and
applying a forward bias voltage to the second PN junction after reducing the reverse bias voltage applied to the second PN junction by storing the charges when the first transistor is on, and discharging the charges, wherein
when the first transistor is on, the charges are stored in the third PN junction, and
the second PN junction is connected to the third PN junction through wiring.

17. The method according to claim 16, wherein
the first PN junction is a junction between a first well region of a second conductivity type positioned in a semiconductor substrate and a first impurity region of a first conductivity type different from the second conductivity type positioned in the first well region,
the second PN junction is a junction between a second well region of the first conductivity type positioned in the semiconductor substrate and a second impurity region of the second conductivity type positioned in the second well region, and
the third PN junction is a junction between the first well region and a third impurity region of the first conductivity type positioned in the first well region.

18. The method according to claim 17, wherein
the first impurity region is one of a source and a drain of the first transistor, and
the third impurity region is the other of the source and the drain of the first transistor.

* * * * *